(12) United States Patent
Wang et al.

(10) Patent No.: US 8,288,195 B2
(45) Date of Patent: Oct. 16, 2012

(54) METHOD FOR FABRICATING A THREE-DIMENSIONAL THIN-FILM SEMICONDUCTOR SUBSTRATE FROM A TEMPLATE

(75) Inventors: David Xuan-Qi Wang, Fremont, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 388 days.

(21) Appl. No.: 12/731,058

(22) Filed: Mar. 24, 2010

(65) Prior Publication Data
US 2010/0267186 A1  Oct. 21, 2010

Related U.S. Application Data

(63) Continuation-in-part of application No. 12/618,663, filed on Nov. 13, 2009.

(60) Provisional application No. 61/114,378, filed on Nov. 13, 2008, provisional application No. 61/162,830, filed on Mar. 24, 2009.

(51) Int. Cl.
*H01L 21/00* (2006.01)
(52) U.S. Cl. .................. 438/73; 438/71; 438/74
(58) Field of Classification Search .............. 438/68, 438/69, 71, 73, 74
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |

(Continued)

FOREIGN PATENT DOCUMENTS

JP   06-260670 A   9/1994

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Kevin M Picardat
(74) *Attorney, Agent, or Firm* — Hulsey, P.C.; William N. Hulsey, III; Loren T. Smith

(57) ABSTRACT

A method is presented for fabrication of a three-dimensional thin-film solar cell semiconductor substrate from a template. A semiconductor template having three-dimensional surface features comprising a top surfaces substantially aligned along a (100) crystallographic plane of semiconductor template and a plurality of inverted pyramidal cavities defined by sidewalls substantially aligned along a (111) crystallographic plane is formed according to an anisotropic etching process. A dose of relatively of high energy light-mass species is implanted in the template at a uniform depth and parallel to the top surfaces and said sidewalls defining the inverted pyramidal cavities of the template. The semiconductor template is annealed to convert the dose of relatively of high energy light-mass species to a mechanically-weak-thin layer. The semiconductor template is cleaved along the mechanically-weak-thin layer to release a three-dimensional thin-film semiconductor substrate from the semiconductor template.

20 Claims, 13 Drawing Sheets

U.S. PATENT DOCUMENTS

| | | | |
|---|---|---|---|
| 4,409,423 A | 10/1983 | Holt | |
| 4,427,839 A | 1/1984 | Hall | |
| 4,461,922 A | 7/1984 | Gay et al. | |
| 4,479,847 A | 10/1984 | McCaldin et al. | |
| 4,626,613 A | 12/1986 | Wenham et al. | |
| 4,672,023 A | 6/1987 | Leung | |
| 4,922,277 A | 5/1990 | Carlson | |
| 5,024,953 A | 6/1991 | Uematsu et al. | |
| 5,073,230 A | 12/1991 | Maracas et al. | |
| 5,112,453 A | 5/1992 | Behr et al. | |
| 5,208,068 A | 5/1993 | Davis | |
| 5,248,621 A | 9/1993 | Sano | |
| 5,316,593 A | 5/1994 | Olson et al. | |
| 5,348,618 A | 9/1994 | Canham et al. | |
| 5,397,400 A | 3/1995 | Matsuno et al. | |
| 5,459,099 A | 10/1995 | Hsu | |
| 5,494,832 A | 2/1996 | Lehmann et al. | |
| 5,538,564 A | 7/1996 | Kaschmitter | |
| 5,645,684 A | 7/1997 | Keller | |
| 5,660,680 A | 8/1997 | Keller | |
| 5,681,392 A | 10/1997 | Swain | |
| 5,882,988 A | 3/1999 | Haberern et al. | |
| 5,928,438 A | 7/1999 | Salami | |
| 6,091,021 A | 7/2000 | Ruby | |
| 6,096,229 A | 8/2000 | Shahid | |
| 6,114,046 A | 9/2000 | Hanoka | |
| 6,127,623 A | 10/2000 | Nakamura et al. | |
| 6,204,443 B1 | 3/2001 | Kiso et al. | |
| 6,225,193 B1 | 5/2001 | Simpson et al. | |
| 6,294,725 B1 | 9/2001 | Hirschberg et al. | |
| 6,331,208 B1 | 12/2001 | Nishida et al. | |
| 6,399,143 B1 | 6/2002 | Sun | |
| 6,416,647 B1 | 7/2002 | Dordi et al. | |
| 6,429,037 B1 | 8/2002 | Wenham et al. | |
| 6,441,297 B1 | 8/2002 | Keller et al. | |
| 6,448,155 B1 | 9/2002 | Iwasaki et al. | |
| 6,461,932 B1 | 10/2002 | Wang | |
| 6,524,880 B2 | 2/2003 | Moon et al. | |
| 6,534,336 B1 | 3/2003 | Iwane | |
| 6,555,443 B1 | 4/2003 | Artmann et al. | |
| 6,566,235 B2 | 5/2003 | Nishida et al. | |
| 6,602,760 B2 | 8/2003 | Poortmans et al. | |
| 6,602,767 B2 | 8/2003 | Nishida et al. | |
| 6,613,148 B1 | 9/2003 | Rasmussen | |
| 6,624,009 B1 | 9/2003 | Green et al. | |
| 6,645,833 B2 | 11/2003 | Brendel | |
| 6,649,485 B2 | 11/2003 | Solanki et al. | |
| 6,653,722 B2 | 11/2003 | Blalock | |
| 6,664,169 B1 | 12/2003 | Iwasaki et al. | |
| 6,756,289 B1 | 6/2004 | Nakagawa et al. | |
| 6,881,644 B2 | 4/2005 | Malik et al. | |
| 6,946,052 B2 | 9/2005 | Yanagita et al. | |
| 6,964,732 B2 | 11/2005 | Solanki | |
| 7,022,585 B2 | 4/2006 | Solanki et al. | |
| 7,026,237 B2 | 4/2006 | Lamb | |
| 7,368,756 B2 | 5/2008 | Bruhns et al. | |
| 7,402,523 B2 | 7/2008 | Nishimura | |
| 8,168,465 B2 * | 5/2012 | Wang et al. | 438/73 |
| 2002/0153039 A1 | 10/2002 | Moon et al. | |
| 2002/0168592 A1 | 11/2002 | Vezenov | |
| 2002/0179140 A1 | 12/2002 | Toyomura | |
| 2003/0017712 A1 | 1/2003 | Brendel | |
| 2003/0039843 A1 | 2/2003 | Johnson | |
| 2003/0124761 A1 | 7/2003 | Baert | |
| 2004/0028875 A1 | 2/2004 | Van Rijn | |
| 2004/0173790 A1 | 9/2004 | Yeo | |
| 2004/0259335 A1 | 12/2004 | Narayanan | |
| 2004/0265587 A1 | 12/2004 | Koyanagi | |
| 2005/0160970 A1 | 7/2005 | Niira | |
| 2005/0172998 A1 | 8/2005 | Gee et al. | |
| 2005/0176164 A1 | 8/2005 | Gee et al. | |
| 2005/0177343 A1 | 8/2005 | Nagae | |
| 2005/0199279 A1 | 9/2005 | Yoshimine et al. | |
| 2005/0272225 A1 | 12/2005 | Weber et al. | |
| 2005/0274410 A1 | 12/2005 | Yuuki et al. | |
| 2005/0281982 A1 | 12/2005 | Li | |
| 2006/0021565 A1 | 2/2006 | Zahler et al. | |
| 2006/0043495 A1 | 3/2006 | Uno | |
| 2006/0054212 A1 | 3/2006 | Fraas et al. | |
| 2006/0070884 A1 | 4/2006 | Momoi et al. | |
| 2006/0105492 A1 | 5/2006 | Veres et al. | |
| 2006/0196536 A1 | 9/2006 | Fujioka | |
| 2006/0231031 A1 | 10/2006 | Dings et al. | |
| 2006/0266916 A1 | 11/2006 | Miller et al. | |
| 2006/0270179 A1 * | 11/2006 | Yang | 438/401 |
| 2006/0283495 A1 | 12/2006 | Gibson | |
| 2007/0077770 A1 | 4/2007 | Wang et al. | |
| 2007/0082499 A1 | 4/2007 | Jung et al. | |
| 2008/0047601 A1 | 2/2008 | Nag et al. | |
| 2008/0128641 A1 | 6/2008 | Henley et al. | |
| 2008/0157283 A1 | 7/2008 | Moslehi | |
| 2008/0210294 A1 | 9/2008 | Moslehi | |
| 2008/0264477 A1 | 10/2008 | Moslehi | |
| 2008/0289684 A1 | 11/2008 | Moslehi | |
| 2008/0295887 A1 | 12/2008 | Moslehi | |
| 2009/0042320 A1 | 2/2009 | Wang et al. | |
| 2009/0107545 A1 | 4/2009 | Moslehi | |
| 2009/0301549 A1 | 12/2009 | Moslehi | |
| 2010/0022074 A1 | 1/2010 | Wang et al. | |
| 2010/0116316 A1 | 5/2010 | Moslehi et al. | |

FOREIGN PATENT DOCUMENTS

| | | |
|---|---|---|
| JP | 2002-2299661 A | 10/2002 |
| WO | PCT/EP1999/008573 | 5/2000 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

\* cited by examiner

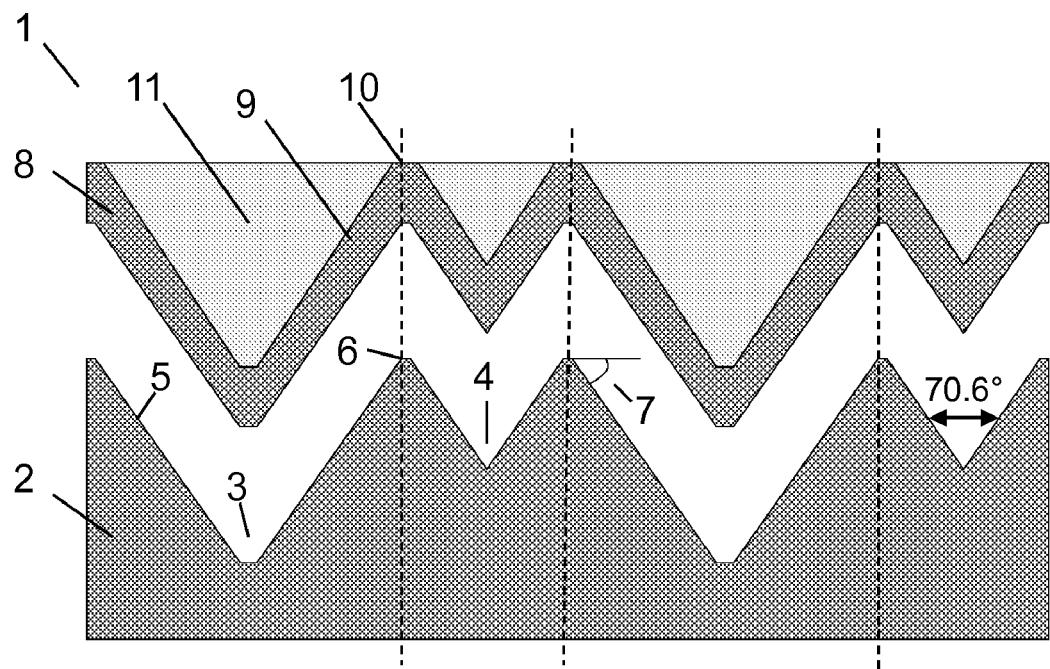
*FIG. 2*
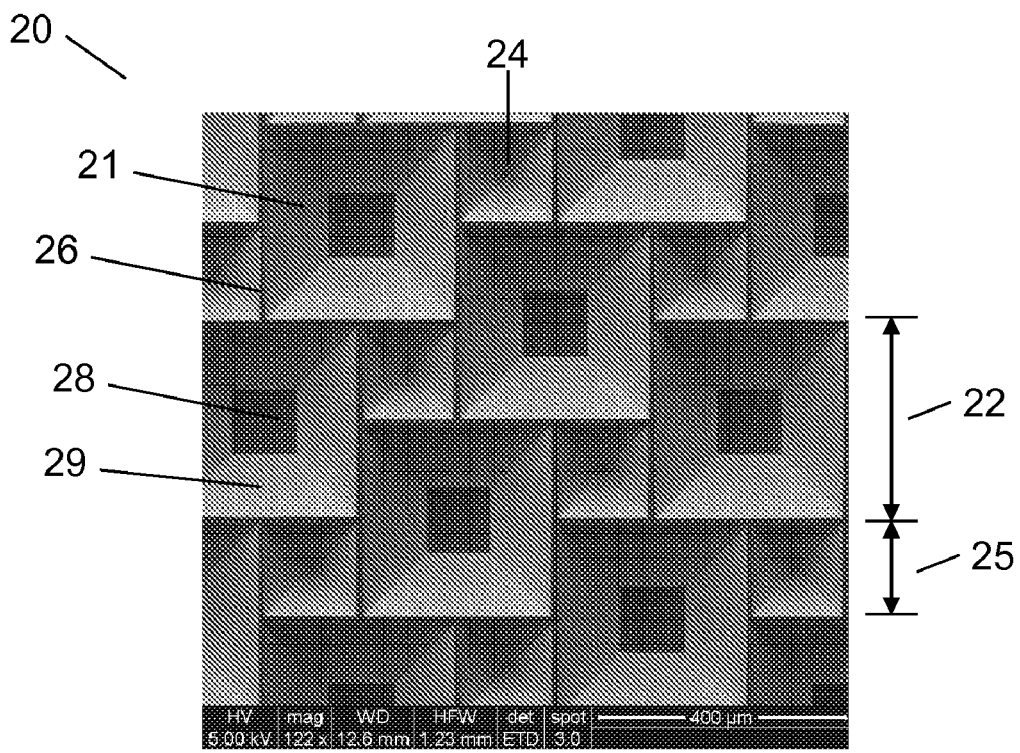
*FIG. 3 (PHOTOGRAPH)*

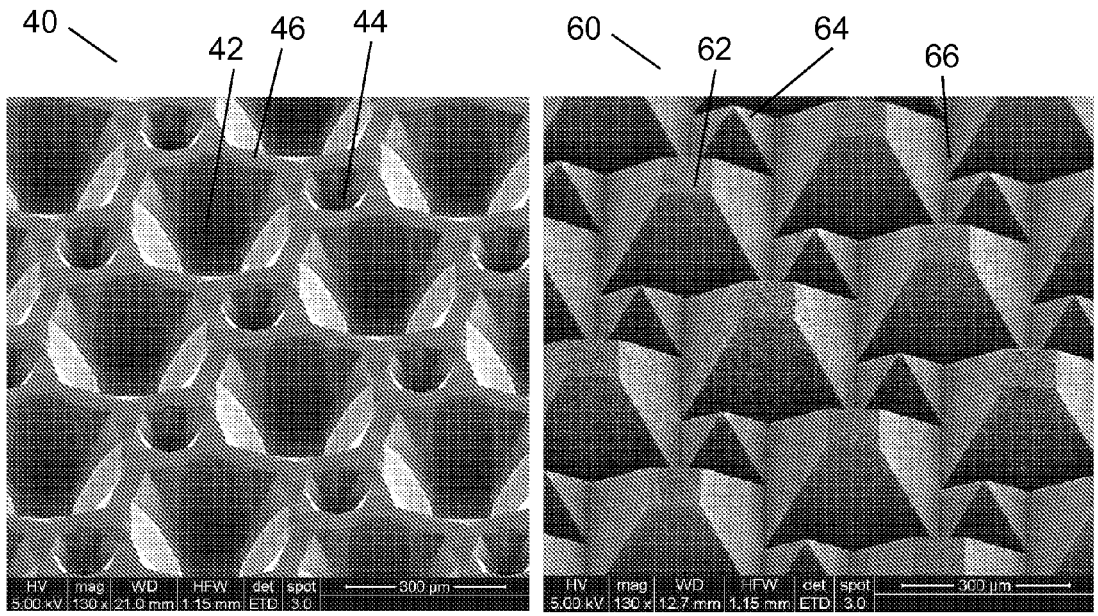
FIG. 4A (PHOTOGRAPH)
FIG. 4B (PHOTOGRAPH)
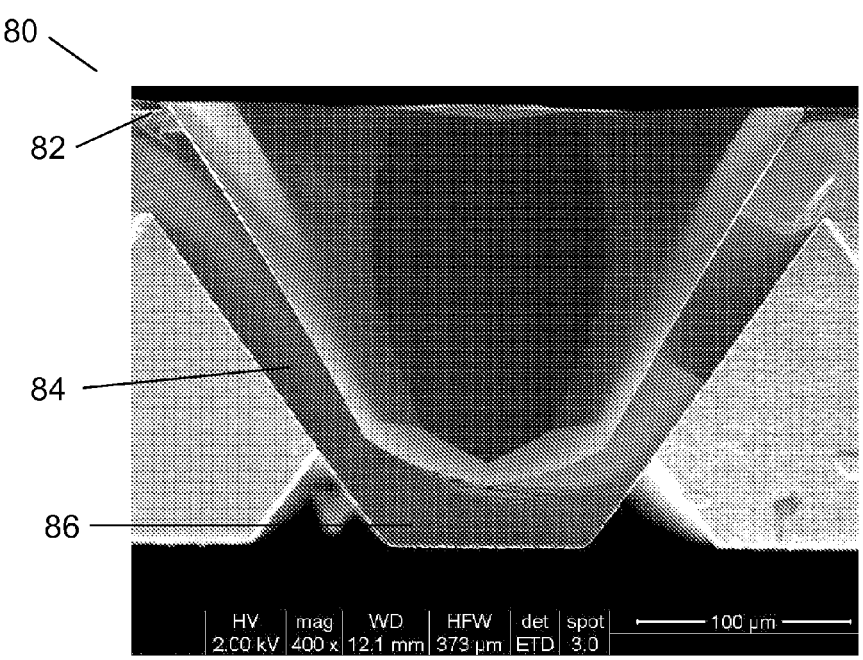
FIG. 4C (PHOTOGRAPH)

METHOD FOR FABRICATING A THREE-DIMENSIONAL THIN-FILM SEMICONDUCTOR SUBSTRATE FROM A TEMPLATE

CROSS-REFERENCE TO RELATED APPLICATIONS

This application claims priority to and is a continuation in part of pending U.S. patent application Ser. No. 12/618,663 "SUBSTRATES FOR HIGH-EFFICIENCY THIN-FILM SOLAR CELLS BASED ON CRYSTALLINE TEMPLATES", by David Xuan-Qi Wang filed on Nov. 13, 2009, which is incorporated herein by reference in its entirety and made part of the present U.S. Utility patent application for all purposes.

This application also claims the benefit of provisional patent application 61/162,830 filed on Mar. 24, 2009, which is hereby incorporated by reference in its entirety.

FIELD

This disclosure relates in general to the field of photovoltaics and solar cells, and more particularly to structures and methods for manufacturing three-dimensional thin-film solar cells from a template.

BACKGROUND

Current methods for manufacturing a three-dimensional thin-film solar cell (3-D TFSC) include forming a 3-Dimensional thin-film silicon substrate (3-D TFSS) using a silicon template. The template may comprise a plurality of posts and a plurality of trenches between said a plurality of posts. The 3-D TFSS may then be formed by forming a sacrificial layer on the template, subsequently depositing a semiconductor layer, selective etching the sacrificial layer and releasing the semiconductor layer from the template. More specifically, the semiconductor layer is a self-supporting, free-standing three-dimensional (3D) epitaxial silicon thin film deposited on and released from a low-cost reusable crystalline silicon substrate template. The reusable silicon template may be reused to form the 3D film numerous times before being reconditioned or recycled. Select portions of the released 3-D TFSS are then doped with a first dopant, and other select portions are than doped with a second dopant. After surface passivation processes, emitter and base metallization regions are formed to complete the solar cell structure. FIG. 1A illustrates a partial view of a re-usable mono-crystalline silicon template with hexagonal-prism posts according to the U.S. Patent Pub. No. 2008/0264477A1 by common inventor Mehrdad M. Moslehi and which is hereby incorporated by reference. FIG. 1B illustrates a partial view of a 3D thin-film, hexagonal-honeycomb-prism substrate with rear/bottom base silicon layer after release from the reusable template according to the U.S. Patent Pub. No. 2008/0264477A1.

The above referenced three-dimensional thin film solar cell templates, substrates, and cells provide cost, performance, and mechanical strength advantages compared to traditional flat solar cells with a similar amount of silicon because 3-D TFSC have superior mechanical strength, better light trapping, and lower cell processing costs because of their self-aligned nature.

From a mechanical structure perspective, given a fixed amount of silicon structural material, a honeycomb 3-D TFSS may provide a desirable mechanical rigidity and strength. However, from the fabrication process perspective, the trenches among the neighboring hexagonal pillars on the template need to be filled by epitaxial silicon growth and the substrate formed by the filled layer needs to be released from the template. These processes are often costly and difficult. Design and process improvements need to be made in making the relatively high aspect ratios trenches, epitaxial filling of the trenches and releasing a TFSS from the trenches.

Additionally, known flat thin film solar cells often require surface texturing to reduce reflectance losses which requires a minimum film thickness of preferably tens of microns (e.g., >30 μm) to avoid texturing etch-induced punch-through pinholes. Also, flat thin-film silicon substrates may have reduced mean optical path length which reduces IR absorption and results in reduced cell quantum efficiency. And flat thin-film crystalline silicon substrates may have poor mechanical strength for cell and module processing needs. Micro cracking defects at substrate edges and pinholes defects within the substrate could cause cracking initiations and these cracks propagate easily along the crystallographic directions.

Mono-crystalline silicon is the most extensively used material for photovoltaic applications and efficiencies up to 24% have been achieved using lab-cell processes. But the high cost of high-quality silicon material limits the widespread use of such solar modules. Layer transfer processes with the aim to form a thin mono-crystalline silicon film separated/cleaved from a silicon wafer have been developed. U.S. Patent Publication No. US2009/0042369A1 describes such a method for fabricating a free-standing flat or co-planar silicon layer by using high energy implantation and associated thermal treatment and cleaving processes. Similar methods have been developed and used for making SOI wafers—such as process disclosed in U.S. Pat. No. 5,374,564.

There are a number of major issues, problems, and challenges with the use of flat or co-planar silicon thin films (e.g., films with thicknesses of well below 50 μm) for high-performance solar cells, including but not limited to:

(1) Difficulties associated with sufficient surface texturing of the thin silicon film to reduce surface reflectance losses. For example, planar (111) orientation silicon wafers are used in the layer transferring method disclosed in U.S. Patent Pub. No. 2009/0042369A1 for the ease of cleaving along the (111) directions. However it is difficult and costly to create surface texturing on flat surfaces that are made of (111) crystal planes.

(2) Substantially reduced mean optical path length resulting in reduced photon absorption, particularly for photons with energies near the infrared bandgap of silicon, resulting in reduced solar cell quantum efficiency (reduced short-circuit current density or $J_{sc}$).

(3) Lack of rigidity and mechanical support of the thin film during cell and module processing steps. This disadvantage relates to the mechanical strength of a large-area (e.g., 200 mm×200 mm) thin silicon film. It is well known that reducing the large-area crystalline silicon wafer thickness to below 100 μm results in a substantial loss of mechanical strength/rigidity and such thin wafers tend to be flexible and very difficult to handle without breakage through the entire cell fabrication process flow. As a result, large-area, co-planar (flat) silicon films thinner than, for instance, 50 μm must be properly mounted and supported on a cost-effective substrate for high-yield solar cell and module processing.

SUMMARY

Therefore a need has arisen for a three-dimensional thin-film substrate manufacturing method which provides fabrication process improvements and manufacturing cost reductions for forming a three-dimensional thin-film solar cell (3-D TFSC). In accordance with the disclosed subject matter, a three-dimensional thin-film semiconductor substrate (3-D TFSS) fabrication method is provided which substantially eliminates or reduces disadvantages and problems associated with previously developed 3-D TFSS.

According to one aspect of the disclosed subject matter, a template having a plurality of top surface inverted pyramidal surface structures defined by sidewalls aligned along the (111) crystallographic plane is formed. A maximum concentration layer of a high energy light-mass species is then formed at a controlled depth under and parallel to the top surfaces of the template. The template is then annealed to convert the maximum concentration layer of high energy light-mass species to a mechanically-weak-thin (MWT) layer. The template is then cleaved at the MWT layer to release a 3-D TFSS from the reusable template.

In one embodiment, the template is made of mono-crystalline silicon. In yet another embodiment, the high energy light-mass species is hydrogen. In yet another embodiment, the high energy light-mass species is helium.

Technical advantages of the disclosed subject matter include fabrication process improvements and manufacturing cost reductions by utilizing the (111) crystallographic orientation plane to make inverted pyramid cavities on the template. Further, the inverted pyramidal cavities provide increased mechanical rigidity to the 3-D TFSS that is made from the template. Further, the template may be reused through multiple three-dimensional thin-film solar cell semiconductor substrates fabrication cycles of the present method.

Technical advantages associated with the formation of a mechanically-weak-thin layer beneath and parallel to surfaces aligned along the (111) and (100) crystallographic planes include the controlled implantation of a maximum concentration of a high energy species at a uniform depth. Further, other technical advantages include the preservation of template topography after numerous reuses of the template while substantially maintaining the original 3D inverted pyramid template surface topography release of the three-dimensional thin-film semiconductor substrate.

Another technical advantage of the simplified fabrication processes and uniform implantation of a maximum concentration of a high energy species when using a template having inverted pyramidal cavities is an inverted pyramidal cavity based 3-D TFSS provides improved mechanical rigidity and strength. The strength of the template may be adjusted according to the arrays and staggered patterns of inverted pyramidal cavities provided.

A technical advantage of the present disclosure is innovative solar cell designs and technologies based on the use of self-supporting, free-standing, three-dimensional (3D) silicon thin films. The 3-D TFSCs described may be made to be relatively rigid, semi-rigid, or flexible depending on the structural design parameters of the cell substrate. Given an equal amount of silicon usage, the 3-D TFSS disclosed provides advantages over substrates made of flat thin-film (TF) crystalline silicon such as the following:

(1) Three-dimensional thin-film solar cells disclosed do not require a minimum film thickness;

(2) Three-dimensional thin-film solar cells disclosed trap light extremely efficiently by virtue of their 3D nature;

(3) Three-dimensional thin-film solar cells disclosed are mechanically robust because of their unique 3D structure, providing enhanced mechanical strength and handle-ability.

Further technical advantages of the disclosed subject matter include: 1) utilizing semiconductor templates consisting of known crystallographic silicon planes, i.e., the (111) and (100) planes, and 2) the large cavity opening angle)(70.6° of the disclosed silicon template formed by the cavity sidewall (111) planes is much wider than that may be etched from using deep reactive ion etch (DRIE) silicon etch.

The disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTIONS OF THE DRAWINGS

For a more complete understanding of the disclosed subject matter and advantages thereof, reference is now made to the following description taken in conjunction with the accompanying drawings in which like reference numbers indicate like features and wherein:

FIG. 2 illustrates a cross-sectional drawing of an inverted pyramidal template and a released corresponding three-dimensional thin-film silicon substrate;

FIG. 3 is an image of a fabricated inverted pyramidal silicon template;

Figure 5:
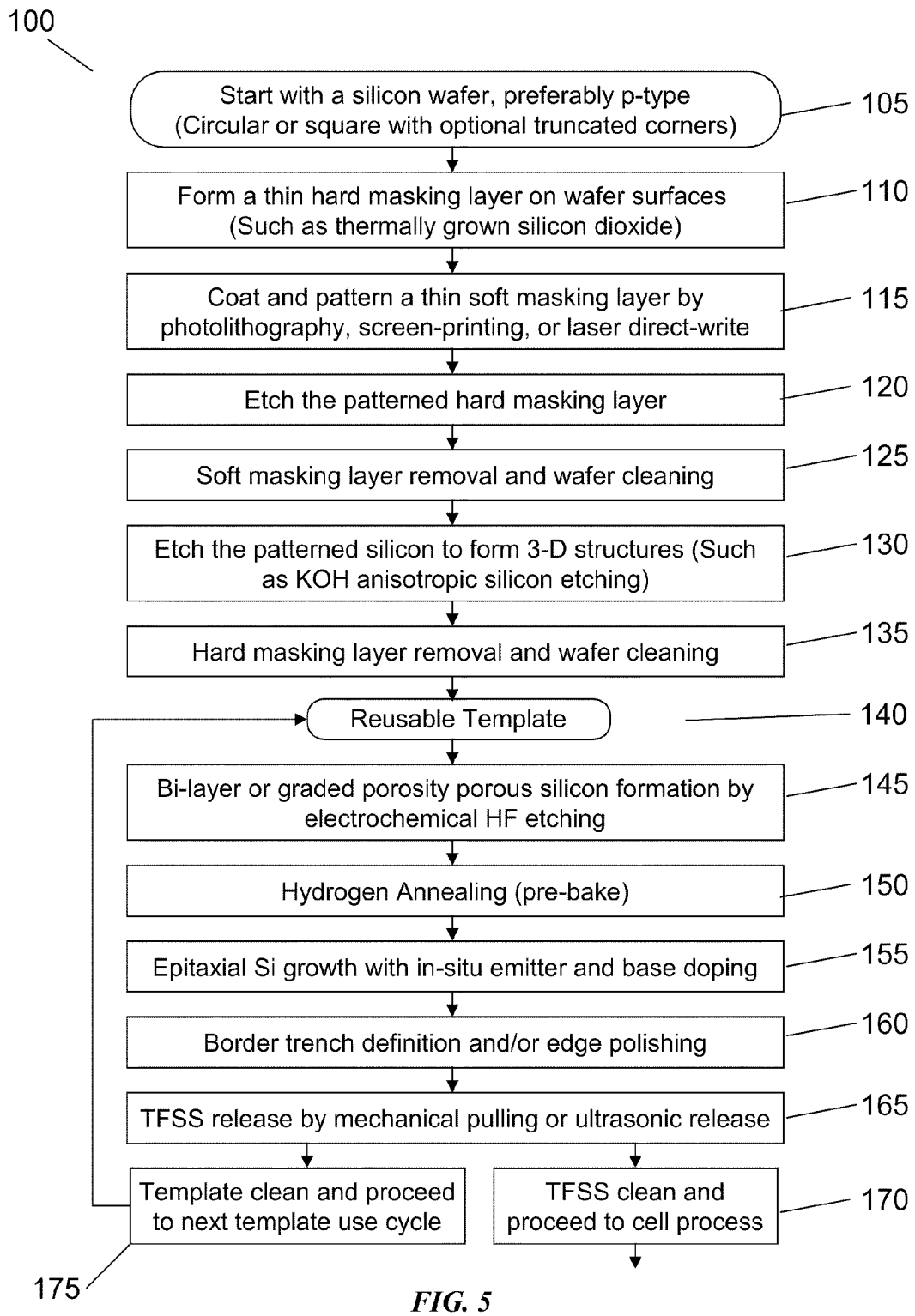
Figure 7:
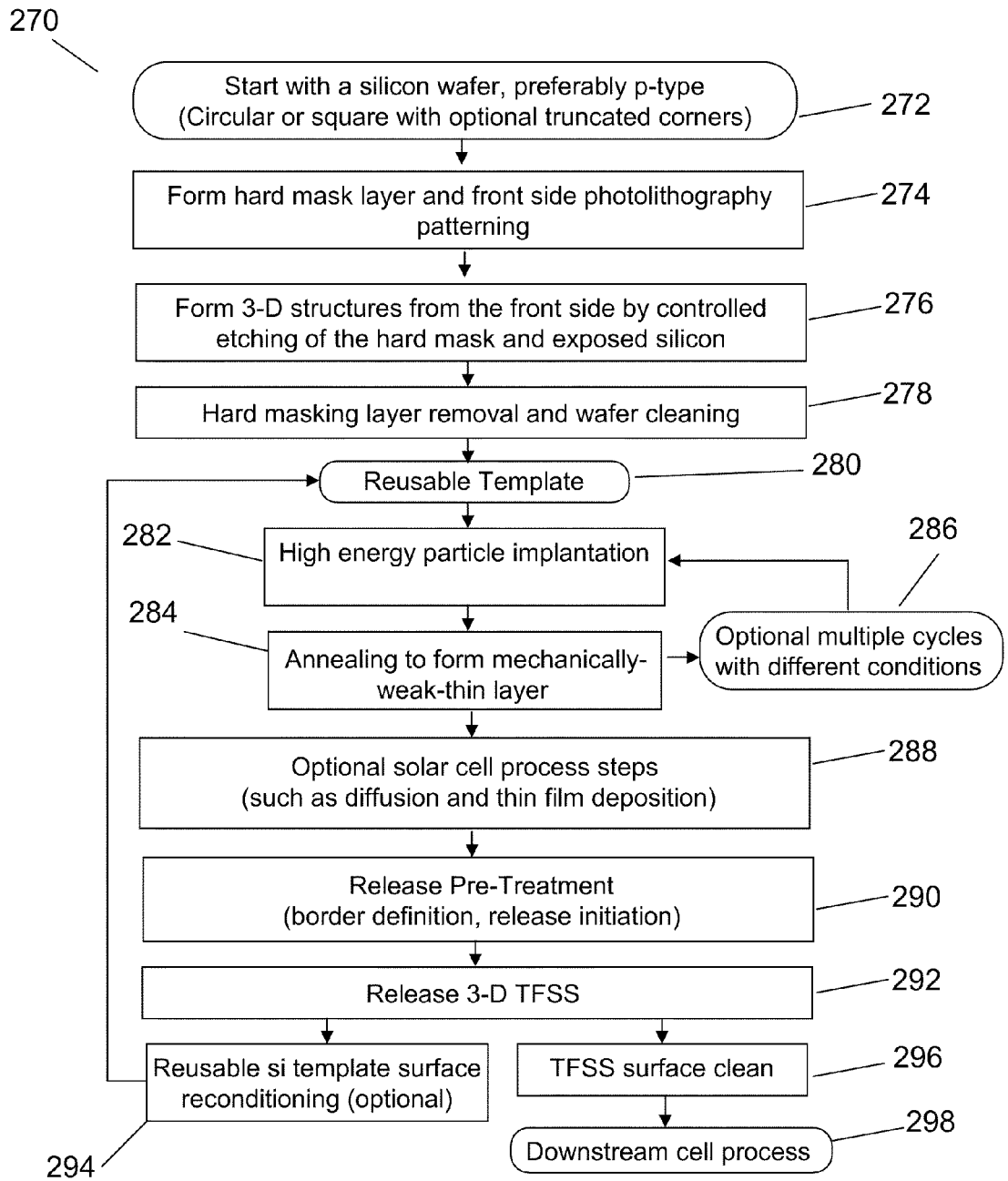
Figure 8A:
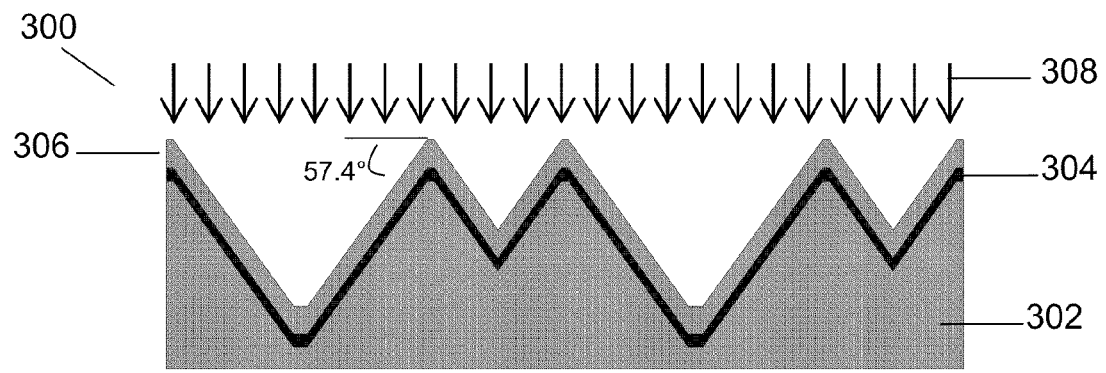
Figure 8B:
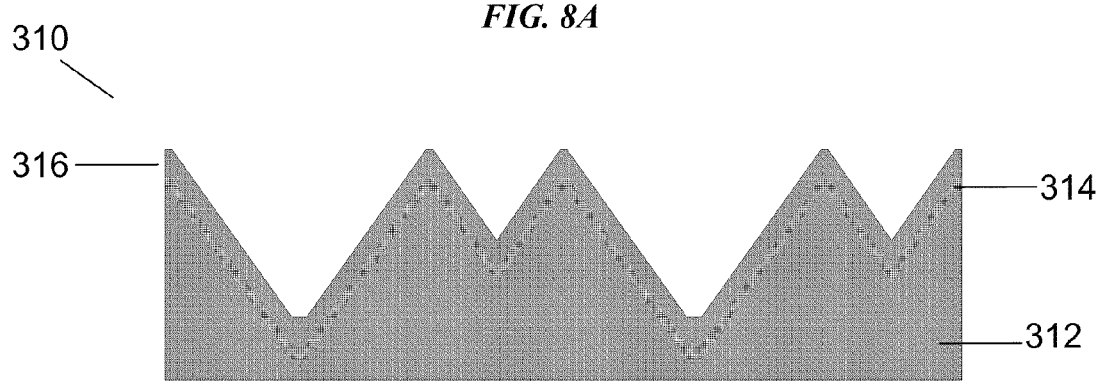
Figure 8C:
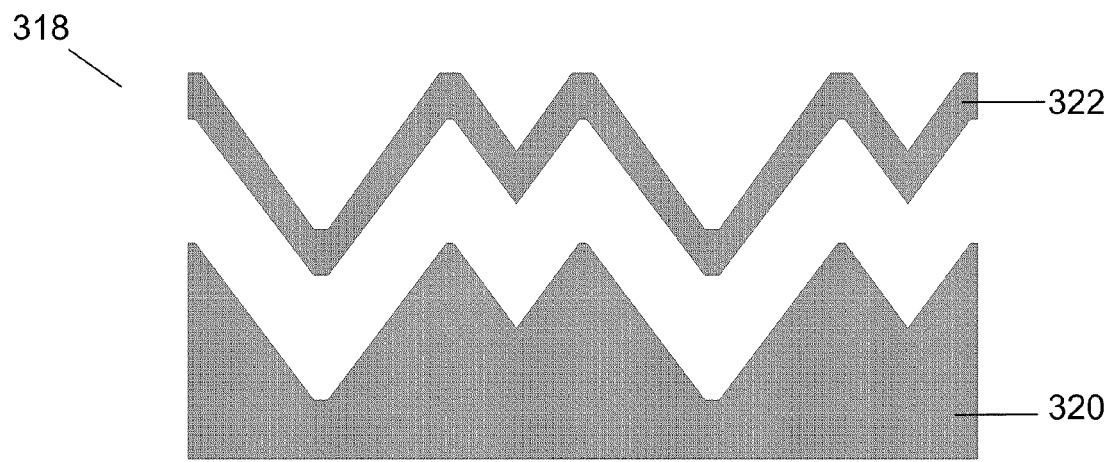
Figure 9:
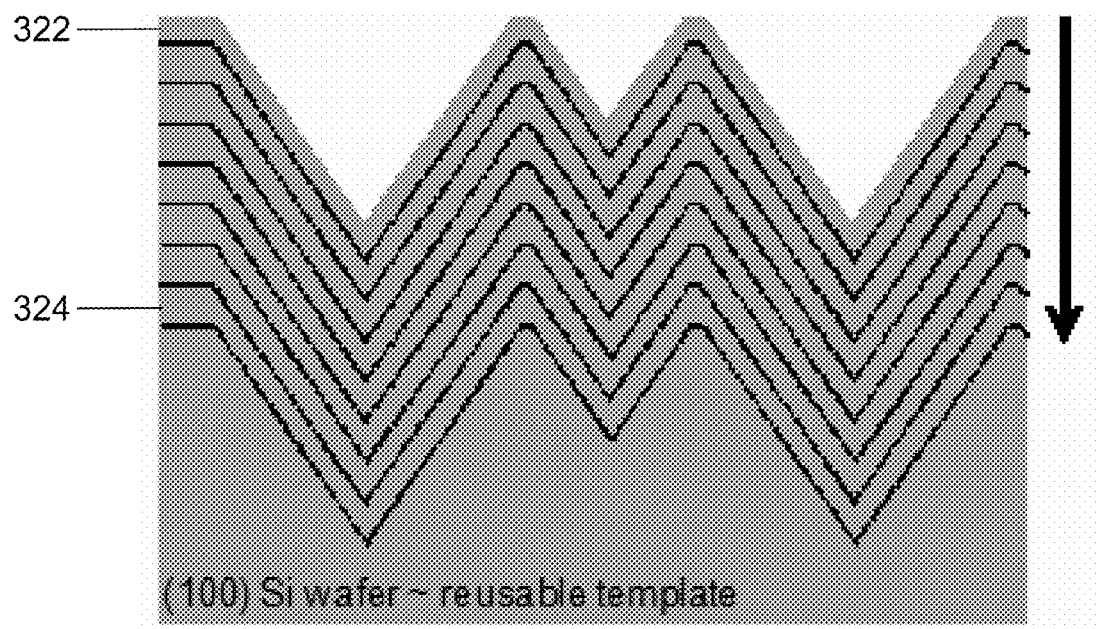
Figure 10:
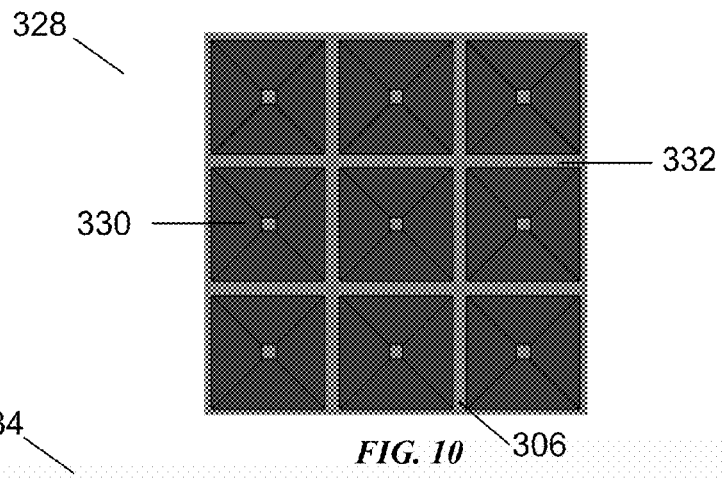
Figure 12:
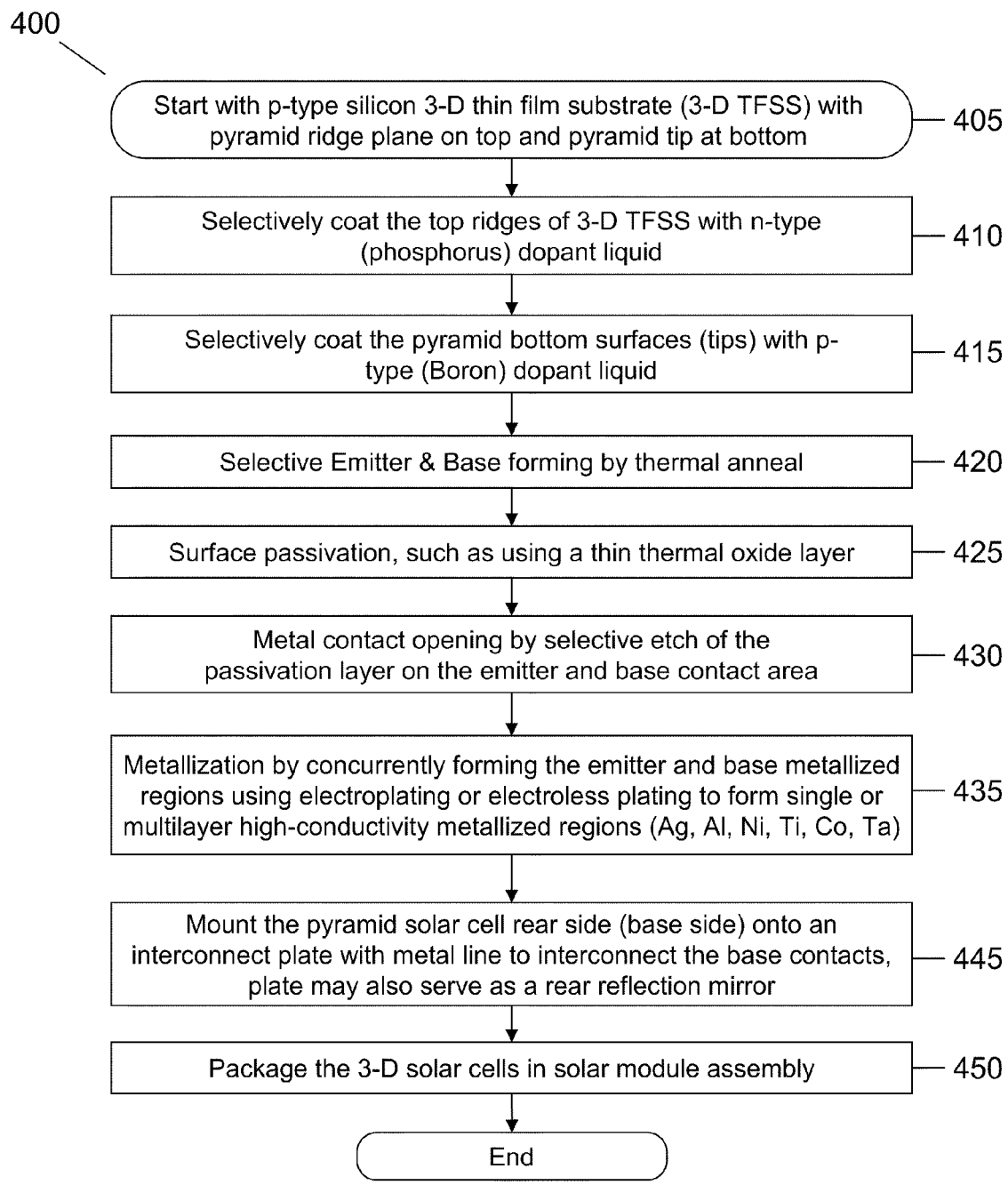

FIGS. 4A, 4B, and 4C are images of a fabricated three-dimensional thin-film silicon substrate that is made of epitaxial silicon and created according to the disclosed epitaxial silicon layer release method;

FIG. 5 is a process flow depicting major fabrication process steps for manufacturing an inverted pyramidal silicon template and three-dimensional thin-film silicon substrate;

FIGS. 6A through 6G illustrates a process flow for manufacturing an inverted pyramidal silicon template and a three-dimensional thin-film silicon substrate;

FIG. 7 is a process flow depicting the major fabrication steps for manufacturing a three-dimensional thin-film silicon substrate according to the disclosed mechanically-weak-thin layer formation process;

FIGS. 8A through 8C illustrate a process flow for manufacturing a three-dimensional thin-film silicon substrate according to the disclosed mechanically-weak-thin layer formation process;

FIG. 9 illustrates the top surface topography movement on a template after multiple three-dimensional thin-film semiconductor substrate fabrication cycles according to the disclosed mechanically-weak-thin layer formation process;

FIG. 10 illustrates an array inverted pyramidal pattern on a semiconductor template;

FIGS. 11A through 11D illustrate alternative staggered inverted pyramidal layout patterns on a semiconductor template;

FIG. 12 is a process flow depicting major fabrication process steps for manufacturing a three-dimensional thin-film solar cell; and FIGS. 13A through 13D illustrate a process flow for manufacturing a three-dimensional thin-film solar cell.

DETAILED DESCRIPTION OF THE SPECIFIC EMBODIMENTS

The following description is not to be taken in a limiting sense, but is made for the purpose of describing the general principles of the present disclosure. The scope of the present disclosure should be determined with reference to the claims. And although described with reference to the manufacture and separation of three-dimensional thin-film silicon substrate, a person skilled in the art could apply the principles discussed herein to multiple semiconductor materials.

Preferred embodiments of the present disclosure are illustrated in the drawings, like numbers being used to refer to like and corresponding parts of the various drawings. The innovative 3-D TFSS designs, fabrication methods, and technologies of the current disclosure are based on the fabrication of a three-dimensional, self-supporting, semiconductor thin film, cleaved from a reusable crystalline (embodiments include, but are not limited to, monocrystalline or multicrystalline silicon) semiconductor template.

A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials including but not limited to gallium, arsenide, germanium, silicon germanium, silicon carbide, a crystalline compound semiconductor, or a combination thereof. Additional applications include copper indium gallium selenide (CIGS) and cadmium telluride semiconductor thin films.

Figure 1A:
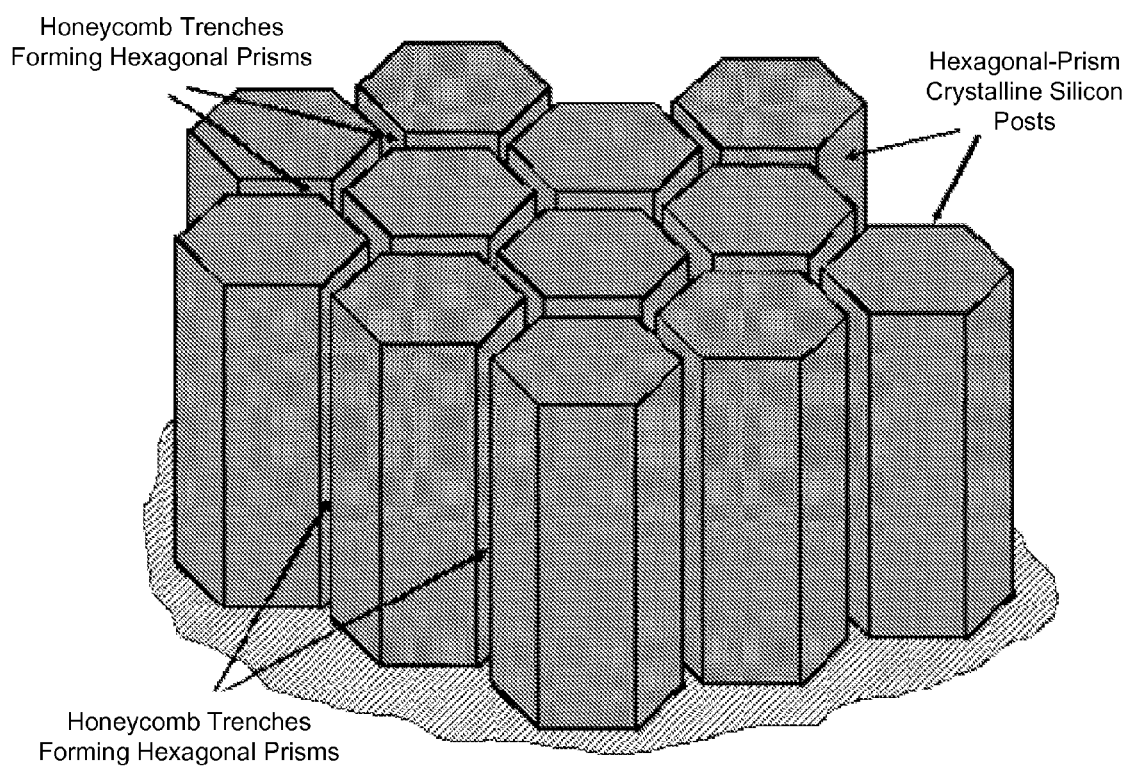
FIG. 1A (PRIOR ART) shows a prior art mono-crystalline silicon template.

FIG. 1A illustrates a partial view of a re-usable monocrystalline silicon template with hexagonal-prism posts disclosed in U.S. Pat. Pub. No. 2008/0264477A1. The hexagonal pillars are etched by deep-reactive ion etching (DRIE) with photolithographically patterned photoresist as the hard masking layer. The DRIE etching provides well defined high-aspect ratio gaps between the pillars, however the narrow gaps are difficult to fill by the epitaxial silicon growth and it is difficult to release the epitaxial layer from such a template.

Figure 1B:
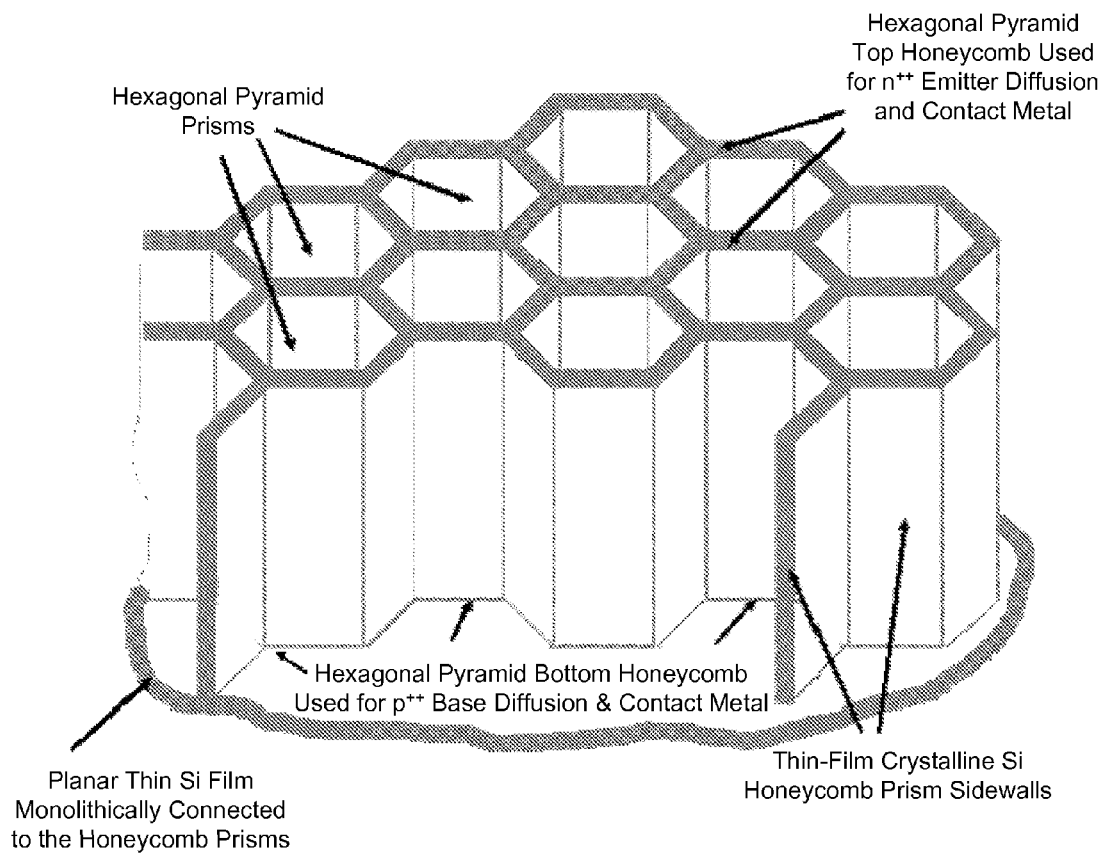
FIG. 1B (PRIOR ART) shows a prior art three-dimensional thin-film substrate after release from the template in FIG. 1A.

FIG. 1B illustrates a partial view of a 3D thin-film hexagonal-honeycomb-prism substrate with a rear/bottom base silicon layer after release from a reusable template disclosed in U.S. Pat. Pub. No. 2008/0264477A1.

FIG. 2 illustrates a cross-sectional drawing of an inverted pyramidal semiconductor template and a corresponding released three-dimensional thin-film semiconductor substrate.

Inverted pyramidal template 2 is used to form corresponding released 3-D TFSS 8. As shown, the inverted pyramidal template consists of large inverted pyramidal cavities 3 and small inverted pyramidal cavities 4. Large inverted pyramidal cavity 3 and small inverted pyramidal cavity 4 which are defined by walls, such as wall 5 aligned along a (111) plane of inverted pyramidal template 2. Top surface 6 is aligned along a (100) plane of inverted pyramidal template 2. The inverted pyramid-shape cavities may be chemically etched by anisotropic silicon etchant and the angle between a sidewall (such as wall 5) and a top lateral plane (such as top surface 6), is about 54.7° (angle 7)—which is the defined angle between two (111) and (100) silicon crystallographic planes. Shown, small inverted pyramidal cavities 4 have an apex defined by walls aligned along the (111) crystallographic planes giving the apex, or tip, of the inverted pyramid an angle of 70.6°. Large inverted pyramidal cavities 3 have a flat apex, or flat tip, aligned along the (100) crystallographic plane. A semiconductor template of the disclosed subject matter may employ various apex styles dependent on shape of the 3-D TFSS desired.

Released 3-D TFSS 8 has a bottom surface profile conformal to the top of inverted pyramidal template 2. Wall 9 defines inverted pyramidal cavity 11 on released 3-D TFSS 8 and surface ridge 10 defines the base opening of inverted pyramidal cavity 11.

FIG. 3 presents a top Scanning Electron Microscope (SEM) partial view of a fabricated inverted pyramidal silicon template. Structured silicon template 20 consists of anisotropically etched large pyramid cavity 21 and small pyramid cavity 24. The top opening size 22 of the large cavities is in the range of 10 um to 1 mm and the top opening size 25 of the small cavities is a partial of 22. As shown the opening size of the large cavities, 22, is about 300 um and opening size of the small cavities, 25, is about 150 um. In this case, the depth of the small cavities is about 110 um and the depth of the large cavities is about 200 um. Top cavity surface 26 and bottom cavity surface 28 are aligned along (100) silicon crystallographic planes and sidewalls 29 of the cavities are aligned along (111) silicon crystallographic planes. Small pyramid cavity 24 has a pointed cavity apex/bottom which occurs at the intersection of four (111) sidewalls. Large pyramid cavity bottom 28 has a flat cavity bottom/apex the size of which may be in the range of 0 to 100 um. As shown, top cavity surface 26 is the ridge defining the opening between inverted pyramidal cavities. Top cavity surface 26 is preferably narrow and less than 10 um wide.

FIG. 4A presents a SEM partial view 40 of an embodiment of a fabricated three-dimensional thin-film silicon substrate from a tilted top perspective. The 3-D TFSS shown is made of epitaxial silicon and is released from a buried porous silicon layer. The 3-D TFSS consists of a staggered pattern of large cavities, 42, and small cavities, 44. However due to the nature of the epitaxial silicon growth, crystallographic faceting occurs and results in a structure quite different from the inverted pyramidal cavities on the semiconductor template from which the 3-D TFSS was made in accordance with the disclosed subject matter. Further, ridge 46 between the cavities and defining a base opening of large cavity 42 is wider on its top side due to epitaxial overgrowth on the top surfaces aligned along the (100) crystallographic plane of a semiconductor template. The degree or amount of the shape change depends on the overall epitaxial silicon thickness. A thicker epitaxial thickness results in more shape change from the original silicon template structure from which 3-D TFSS was made. These shape and geometrical changes improve the mechanical strength of the 3-D TFSS and make the light trapping more effective.

FIG. 4B presents a SEM partial view 60 of an embodiment of a fabricated 3-D TFSS from a tilted bottom perspective. The 3-D TFSS shown is made of epitaxial silicon and is released from a buried porous silicon layer. The shown 3-D TFSS backside is the reverse of the silicon template structure from which 3-D TFSS was made, which consisted of inverted pyramidal cavities forming large pyramid 62 and small pyramid 64 and ridges 66 defining the base openings of the inverted pyramidal cavities on the 3-D TFSS.

FIG. 4C presents a SEM partial view 80 of an embodiment of a fabricated 3-D TFSS from a cross-sectional perspective. The 3-D TFSS shown is made of epitaxial silicon and is released from a buried porous silicon layer. Depending on the epitaxial growth process conditions, the thickness of the top ridge 82, sidewall 84 and bottom 86 may be different and could be purposefully tuned to achieve optimum mechanical, optical and electrical performances.

A 3-D TFSC fabrication process in accordance with the disclosed subject matter may comprise the following major steps:

(1) Template fabrication: 3-D inverted pyramidal patterns/structures are etched from a silicon wafer front surface and into the bulk silicon to form a silicon template. The structured silicon template is then used in the formation of a 3-D TFSS. The template may be capable of being used numerous times to fabricate numerous 3-D TFSS before being reconditioned or recycled. The template may be reused for as long as it remains relatively free of dislocations and/or for as long as it maintains an acceptable pyramid pattern having a pyramidal size and sidewall surface conditions within acceptable control limits (e.g. as gauged by in-line metrology);

(2) 3-D TFSS (substrate) fabrication: After forming low and high porosity porous silicon layers (or a graded porosity porous silicon layer) on the template front surface, epitaxial silicon is grown from the front template surface. In-situ emitter and base doping may be conducted during epitaxial silicon growth. The 3-D TFSS is then formed by releasing/separating the epitaxial silicon layer from the template. The released 3-D TFSS goes through subsequent solar cell processing steps and the template may be re-used after proper cleaning and optional reconditioning;

(3) Cell fabrication process: In the process module, the 3-D TFSS is optionally doped to form emitter and base regions if the doping is not conducted prior to the epitaxial layer release. Then a surface passivation layer and an antireflection layer are deposited, optional contact openings are formed, and metallization steps are conducted to form a 3-D TFSC; and (4) Module assembly and integration process: After proper testing and inspection, the fabricated 3-D TFSC may then optionally be mechanically reinforced, interconnected, encapsulated and mounted in the panels.

FIG. 5 is an embodiment of a process flow depicting major fabrication process steps for manufacturing an inverted pyramidal silicon template and three-dimensional thin-film silicon substrate. The silicon template making process starts with step 105 beginning with a mono-crystalline (100) silicon wafer. The starting wafer may be in circular or square shapes. Step 110 involves forming a thin hard masking layer on the exposed wafer surfaces. The hard masking layer is used to mask the silicon surface areas that do not need to be etched in the later steps—the surface areas that will become the top surface of the template. The proper hard masking layer includes, but is not limited to, thermally grown silicon oxide and low-pressure vapor phase deposited (LPCVD) silicon nitride. Step 115 involves a photolithography step, which consists of photoresist coating, baking, UV light exposure over a photomask, post baking, photoresist developing, wafer cleaning and drying. After this step, the pattern on the photomask depicting an array or a staggered pattern of inverted pyramidal base openings, will be transferred to the photoresist layer. The patterned photoresist layer is used as a soft masking layer for the hard masking layer etching of step 120. Step 120 involves further transferring the photoresist pattern to the hard masking layer layered underneath by chemical etching, such as etching a thin silicon oxide layer with buffered HF solution. Other wet etching methods and dry etching methods as known in semiconductor and MEMS wafer processing may also be used. In step 125 the remaining soft masking layer, i.e. the photoresist layer, is removed and the wafer is cleaned. Examples of photoresist removal process include wet methods, such as using acetone or piranha solution (a mixture of sulfuric acid and hydrogen peroxide), or dry methods such as oxygen plasma ashing. In step 130 the wafers are batch loaded in an anisotropic silicon wet etchant such as KOH solution. The typical etch temperature is in the range of 50° C. to 80° C. and etch rate is about 0.2 um/min to 1 um/min. TMAH (tetramethylammonium hydroxide) is an alternative anisotropic silicon etching chemical. The KOH or TMAH silicon etch rate depends upon the orientations to crystalline silicon planes. The (111) family of crystallographic planes are etched at a very slow rate and are normally "stop" planes for the anisotropic etching of a (100) silicon wafer with patterned hard mask. As a result, the intersection of two (111) planes or a (111) plane with a bottom (100) plane produce anisotropic etching structures for (100) silicon wafers after a time-controlled etch. Examples of these structures include V-grooves and pyramidal cavities with sharp tip cavity bottom (where (111) planes meet) or a small flat cavity bottom (a remaining (100) plane).

Advantages of the inverted pyramidal template of the present disclosure include: (i) the template KOH etching process is more convenient to control and has a low manufacturing cost compared to other silicon etching methods, such as RIE dry etching; (ii) the (111) plane dominant 3-D structure provides good porous silicon forming uniformity and epitaxial silicon quality due to the (111) plane sidewall smoothness and predictable and repeatable epitaxial growth rates; (iii) the dimensions, shape, and profiles of the inverted pyramidal structure on the template may be maintained conveniently and restored easily by a short KOH etching if needed after multiple template reuse cycles.

In step 135 of FIG. 5 the remaining hard masking layer is removed, by HF solution in the case the hard masking layer is silicon dioxide. Next, the wafer may be cleaned in standard SC1 (mixture of $NH_4OH$ and $H_2O_2$) and SC2 (mixture of HCL and $H_2O_2$) wafer wet cleaning solutions followed by a thorough deionized wafer rinsing and hot $N_2$ drying. The disclosed process results in a silicon template with inverted pyramidal cavities.

Step 140 of FIG. 5 marks the beginning of a silicon template re-use cycle. In step 145, a porous silicon layer is formed by electrochemical HF etching on the silicon template front surfaces. The porous silicon layer is to be used as a sacrificial layer for epitaxial silicon layer release. The porous silicon layer preferably consists of two thin layers with different porosities. The first thin porous silicon layer is a top layer and is formed first from the bulk silicon wafer. The first thin layer preferably has a lower porosity of 10%~35%. The second thin porous silicon layer is directly grown from the bulk silicon and is underneath the first thin layer of porous silicon. The $2^{nd}$ thin porous silicon layer preferably has a higher porosity in the range of 40%~80%. The top porous silicon layer is used as a crystalline seed layer for high quality epitaxial silicon growth and the bottom underneath higher porosity porous silicon layer is used for facilitating TFSS release due to its less dense physical connections between the epitaxial and bulk silicon interfaces and its weak mechanical strength. Alternatively, a single porous silicon layer with a progressively increased or graded porosity from top to bottom may also be used. In this case, the top portion of the porous silicon layer has a low porosity of 10% to 35% and the lower portion of the porous silicon layer has a high porosity of 40% to 80%. In step 150, before the epitaxial silicon growth, the wafer may be baked in a high temperature (at 950° C. to 1150° C.) hydrogen environment within the epitaxial silicon deposition reactor in order to form coalesced structures with relatively large voids within the higher-porosity porous silicon layer (or portion of a single layer) while forming a continuous surface seed layer of crystalline silicon on the lower-porosity porous silicon layer (or portion of a single layer). In step 155, a mono-crystalline silicon epitaxial layer is deposited on the front side only. The bulk base of the epitaxial layer is p-type, boron ($B_2H_6$) doped. The thickness of the epitaxial layer is preferably in the range of 5 um to 60 um. In step 160, prior to the release of the epitaxial silicon layer, an encompassing border trench may be made on the peripheral of the active wafer area to facilitate the release of the TFSS. The encompassing trenches may be formed by controlled laser cutting and their depths are preferably in the range of 5 um to 100 um. The trenches define the boundary of the 3-D TFSS to be released and allow initiation of the release from the trenched region. The remaining epitaxial silicon layer may be removed by mechanical grinding or polishing of the template edges. Alternatively, the epitaxial silicon layer at the template edge can be removed by mechanical grinding or polishing. As a result, the border of the 3-D TFSS is defined prior to its release. In step 165, the epitaxial layer of silicon is released and separated from the silicon template. The released epitaxial silicon layer is referred to as a 3-D thin film silicon substrate (3-D TFSS). The epitaxial layer release methods disclosed in U.S. Patent Pub. No. 2010-0022074 entitled, SUBSTRATE RELEASE METHODS AND APPARATUS, by common inventor David Xuan-Qi Wang, is hereby incorporated by reference. The 3-D TFSS may be released in an ultrasonic DI-water bath. Or in another release method, the 3-D TFSS may be released by direct pulling with wafer backside and top epitaxial vacuum chucked. Using this method the porous silicon layer may be fully or partially fractured. The chucks may use either electrostatic or vacuum chucking to secure the wafer. The wafer is first placed on bottom wafer chuck with TFSS substrate facing upwards. A bottom chuck secures the template side of wafer, and the top wafer chuck is gently lowered and secures TFSS substrate side of the wafer. The activated pulling mechanism lifts top chuck upwards, and the movement may be guided evenly by slider rails.

In step 170, the released 3-D TFSS backside surface is cleaned by short silicon etching using KOH or TMAH solutions to remove the silicon debris and fully or partially remove the quasi-mono-crystalline silicon (QMS) layer. After removal of the epitaxial silicon layer from the template, the template is cleaned in step 175 by using diluted HF and diluted wet silicon etch solution, such as TMAH and/or KOH to remove the remaining porous silicon layers and silicon particles. Then the template is further cleaned by conventional silicon wafer cleaning methods, such as SC1 and SC2 wet cleaning to removal possible organic and metallic contaminations. Finally, after proper rinsing with DI water and $N_2$ drying, the template is ready for another re-use cycle.

FIGS. 6A through 6D depict cross-sectional drawings illustrating a process flow for manufacturing an inverted pyramidal silicon template.

Figure 6A:
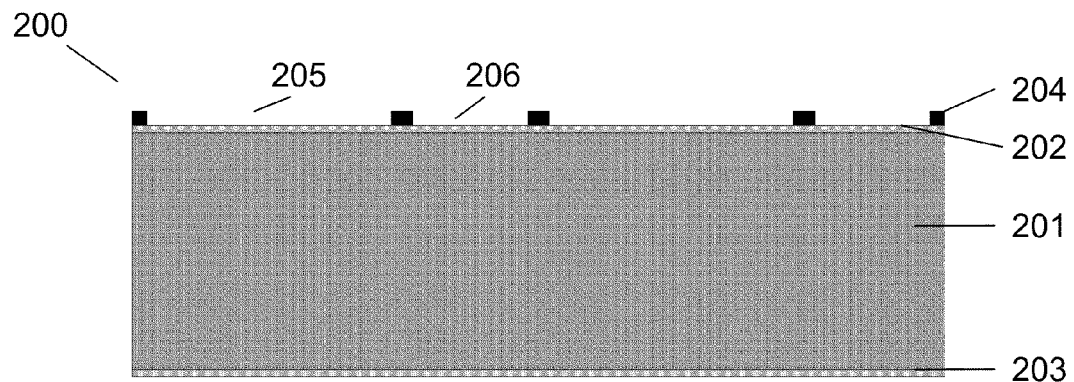

FIG. 6A illustrates mono-crystalline (100) silicon wafer 201 after a hard mask deposition and soft mask patterning. The thickness of silicon wafer 201 is in the range of 0.5 mm to 2 mm. The disclosed template forming process may be applied to a polished or non-polished surface. Alternatively, silicon wafers with square or quasi-square shapes may also be used. Front hard mask layer 202 and backside hard mask layer 203 are thermally grown silicon oxide layers having a thickness in the range of 0.5 um to 1.5 um. The oxide on the wafer edge is not shown. Photolithographic defined or screen-printed photoresist pattern 204 is applied on the front wafer surface. The photolithography process includes photoresist coating, baking, exposure, developing and post baking. The photoresist pattern consists of staggered pattern of large inverted pyramidal base opening 205 and small inverted pyramidal base opening 206. However, the photoresist pattern may also be an array of equally sized inverted pyramidal base openings. The inverted pyramidal base opening patterns should be precisely aligned to the wafer <100> direction on the front surface.

Figure 6B:
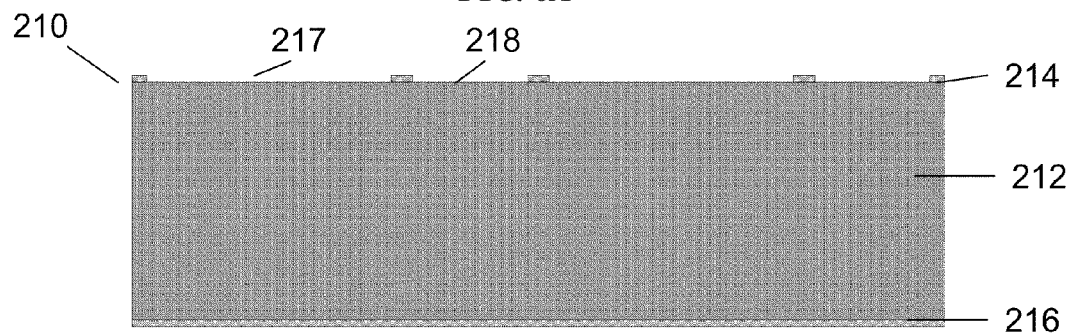

FIG. 6B illustrates wafer 212 after the inverted pyramidal base opening pattern is transferred to the hard masking layer, front oxide layer 214. The pattern transferring from the photoresist layer to the oxide layer is achieved by controlled oxide etching in a buffered HF solution. During HF wet etching, backside and edge oxide layer 216 is protected and keeps an original thickness. The oxide pattern on the front side of wafer 212 then consists of a staggered pattern of large inverted pyramidal base opening 217 and small inverted pyramidal base opening 218 that are aligned to the <100> crystallographic directions on the front lateral plane. After the pattern transfer, the remaining photoresist layer is removed by wet or dry photoresist removal methods. Therefore, the photoresist layer is not shown in FIG. 6B.

Figure 6C:
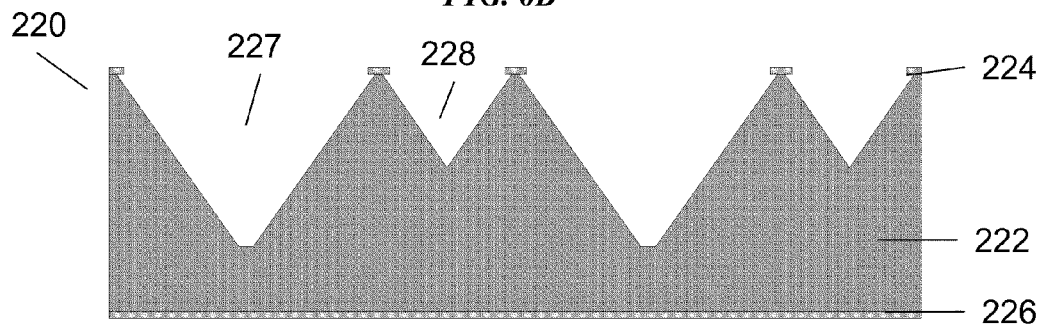

FIG. 6C illustrates wafer 220 after a silicon anisotropic etching step. Large inverted pyramidal cavity 227 and small inverted pyramidal cavity 228 are formed after a timed-controlled silicon etch in a KOH or TMAH solution. The etching temperature is preferably in the range of 50° C. to 80° C. During the silicon etching, the wafer backside and edge surfaces are fully protected by un-patterned oxide layer 226. The KOH etch may be timely controlled so that a certain inverted pyramidal cavity depth may be reached. Alternatively, the KOH etching may be self-terminated when the (111) walls forming the inverted pyramidal cavity meet at the cavity bottom/apex. After the KOH etching, remaining oxide layers 224 and 226 are thinner than before the etching because the oxide is also etched in the KOH or TMAH solution, but with a much slower etch rate than the silicon etch.

Figure 6D:
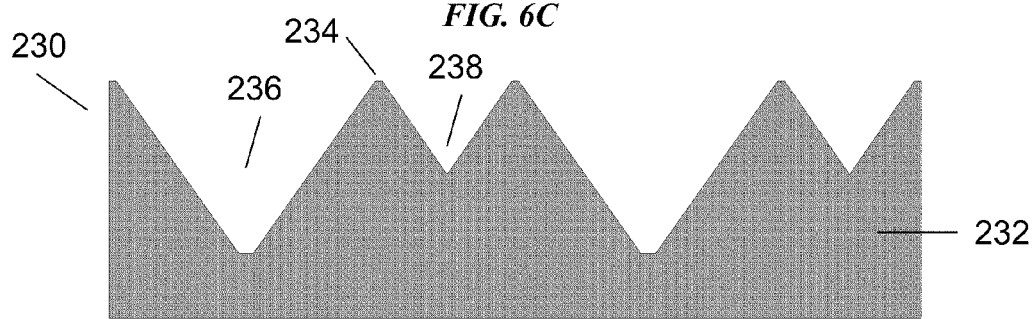

FIG. 6D illustrates inverted pyramidal silicon template 232 after removing the remaining oxide layer in a diluted HF solution followed by standard wafer cleaning in SC2 and SC2, DI water rinsing, and $N_2$ drying. The width of the ridges forming the base openings of the inverted pyramidal cavities, 234 is in the range of 0 to 20 um. The template now comprises a staggered pattern made of large inverted pyramidal cavity 236 and an adjacent small inverted pyramidal cavity 238. The angle between the cavity sidewalls and top surface ridges aligned along the (100) crystallographic plane, the lateral plane, is 54.7°.

Figure 6E:
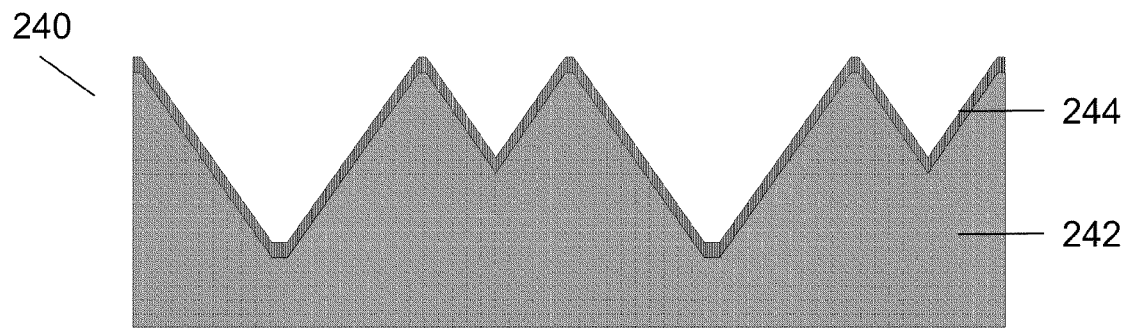
Figure 6F:
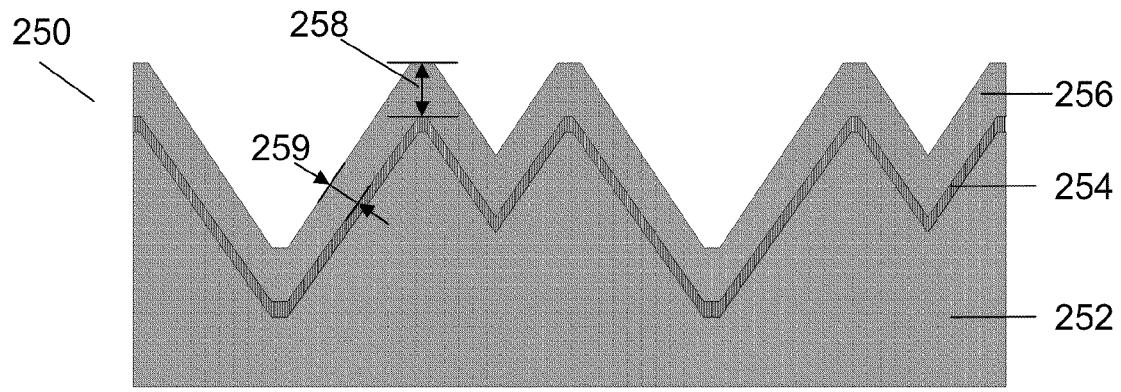
Figure 6G:
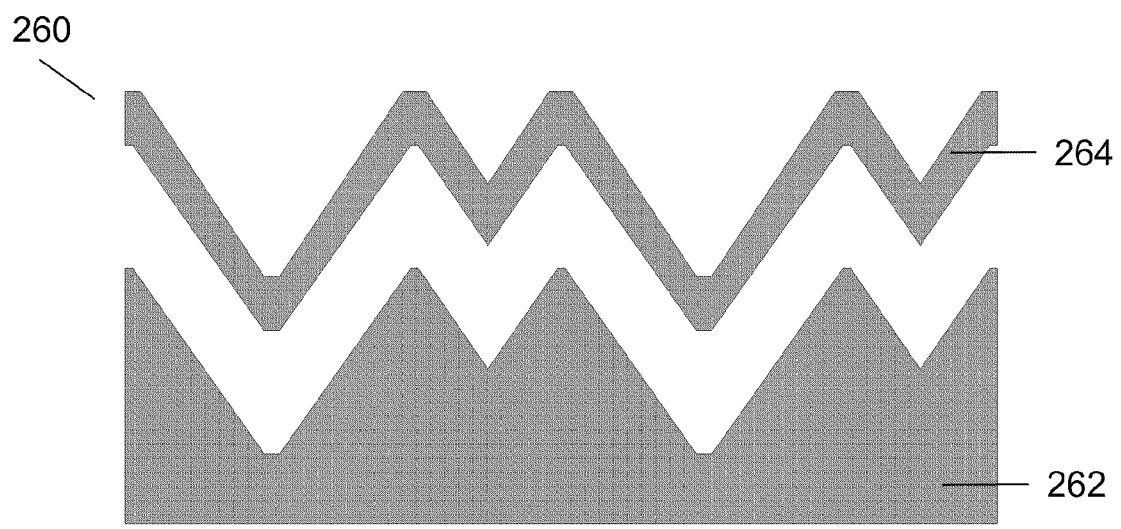

FIGS. 6E through 6G depict cross-sectional drawings illustrating a process flow for manufacturing a 3-D TFSS using an inverted pyramidal silicon template.

As shown is FIG. 6E, porous silicon layer 244 is formed by electrochemical HF etching on the front surface of silicon template 242. The porous silicon is used as a sacrificial layer and may consist of two thin layers with different porosities. The first thin porous silicon layer is on the top and is formed first from silicon wafer 242. The first thin layer preferably has a lower porosity of 10%~35%. The second thin porous silicon layer is formed directly from silicon wafer 242 and is underneath the first thin layer of porous silicon. The second thin porous silicon layer preferably has a higher porosity in the range of 40%~80%. The lower porosity porous silicon layer on top is used as a crystalline seed layer for high quality epitaxial silicon growth and the underneath higher porosity porous silicon layer is used for facilitating TFSS releasing due to its less density physical connections between the epitaxial and bulk silicon interfaces and its weak mechanical strength. Alternatively, a single porosity release layer with a progressively increased or graded porosity from top to bottom may also be used. In this case, the top portion of the porous silicon layer has a low porosity of 10% to 35% and the lower portion of the porous silicon layer has a high porosity of 40% to 80%.

FIG. 6F illustrates silicon template 252 after a thin layer of epitaxial silicon layer growth. In a batch process, after short hydrogen annealing in a temperature range of 950° C. to 1150° C., mono-crystalline silicon epitaxial layer 256 is deposited on porous silicon layer 254 located on the front side of silicon template 252. Mono-crystalline silicon epitaxial layer 256 may p-type, boron ($B_2H_6$) doped during the growth. The thickness of the epitaxial layer is preferably in the range of 5 um to 60 um. It is known that crystallographic orientation is one of the factors that affect the epitaxial growth rate. In the presence of a (100) and a (111) plane on the template, the epitaxial growth rate on the (100) plane is faster than on the (111) plane. The growth rate difference could be as large as 20%. Since the template ridge top surface is a (100) plane and the pyramid cavity sidewalls are (111) planes, the epitaxial silicon layer thickness at the top ridge region 258 is generally thicker than the sidewall regions 259. In addition, since the template top ridge surfaces are more exposed to the gas flow than the wall surfaces defining the inverted pyramidal cavities during the epitaxial growth process, the top portions (forming the base openings of the inverted pyramidal cavities) of the epitaxial layer of the pyramid structure are thicker than the bottom portions (forming the walls defining the inverted pyramidal cavities). This gas transportation limited growth rate differential could be enhanced by tuning gas pressures, flow rates, chamber sizes, and other physical parameters of the epitaxial process. Furthermore, the higher epitaxial growth rates at top portions of the pyramid cavities also generate faceting around the ridge areas. The faceting effect may changes the square opening patterns into polygon opening patterns as shown in FIG. 4A. The combined thickness increases (overgrowth) and shape changes generate a unique structure that resembles a prism-grid structure. As a result, the 3-D TFSS of the present disclosure provides the following unique features:

(1) The thickness increase and resulting polygon shape formed on the top surface of a 3-D TFSS provides significant enhancement to its mechanical rigidity and strength. The template top ridges correspond to the V-grooves of 3-D TFSS when viewed from the backside. When a 3-D TFSS is under a bending load, the V-groove areas have higher stress concentration than the sidewall areas. The increased thickness and the polygon shape at the top portion therefore enhance the mechanical handle-ability of the 3-D TFSS;

(2) The polygon shape and the faceting at its edges and corners provide better light-trapping effects than a square shaped pyramid structure;

(3) After a certain amount of epitaxial growth from the pyramid template, the top surface profile at the ridges may be sharpener than the original template ridge surface profile. The top surface ridge sharpening effect may increase the optical trapping and/or electrical efficiencies; and (4) After the epitaxial growth from the pyramid template, the TFSS surfaces are made of crystallographic planes. When the top surface of the epitaxial layer (before or after the 3-D TFSS release) is exposed to a diluted anisotropic etchant, such as KOH, for a short time, the top surfaces can be further sharpened to increase the optical and electrical efficiencies of the resulting solar cells. Thus, the disclosed subject matter takes advantage of the higher etch rates of convex crystallographic edges than concave edges in anisotropic silicon etching.

FIG. 6G illustrates 3-D TFSS 264 that is released from silicon template 262. Prior to the release, an encompassing border trench, not shown in the figure, may be made on the peripheral of the active wafer area to facilitate the release. The encompassing trenches are formed by controlled laser cutting and their depths are preferably in the range of 5 um to 100 um. The trenches define the boundary of the 3-D TFSS to be released and allow initiation of the release from the trenched region. Alternatively, the thin epitaxial layer on the template edge could be removed first by mechanical grinding and then defining the shape of the 3-D TFSS by laser trimming after it has been released from the template. The released epitaxial layer, referred to as 3-D TFSS 264 is physically separate from silicon template 262. The epitaxial layer release methods disclosed in U.S. Patent Pub. No. 2010-0022074 entitled, SUBSTRATE RELEASE METHODS AND APPARATUS, by common inventor David Xuan-Qi Wang, is hereby incorporated by reference. The epitaxial layer may be released in an ultrasonic DI-water bath. In another release method, the epitaxial layer is released by direct pulling with wafer backside and top epitaxial vacuum chucked. Using this method the porous silicon layer may be fully or partially fractured. The chucks may use either electrostatic or vacuum chucking to secure the wafer. The wafer is first placed on bottom wafer chuck with TFSS substrate facing upwards. A bottom chuck secures the template side of wafer, and the top wafer chuck is gently lowered and secures TFSS substrate side of the wafer. The activated pulling mechanism lifts top chuck upwards, and the movement may be guided evenly by slider rails.

After removal of the epitaxial silicon layer from the template, the template is cleaned by using diluted HF and diluted wet silicon etch solution, such as TMAH and/or KOH to remove the remaining porous silicon layers and silicon particles. The template may then be further cleaned by conventional silicon wafer cleaning methods, such as SC1 and/or SC2 wet cleaning to removal possible organic and metallic contaminations. Finally, after proper rinsing with DI water and drying, the template is ready for another re-use cycle. Next, the released TFSS backside surface is cleaned by short silicon etching using KOH or TMAH solutions to remove the silicon debris and fully or partially remove the QMS layer.

One of the key factors in the template structural design is the use of inverted pyramidal cavity structures instead of non-inverted pyramidal pillar structures. In the present disclosure, the corners/edges where (111) planes meet are "concave". In other words, the (111) planes form the sidewalls of pyramidal cavities. In comparison, there have been reported "convex" cases, where the (111) planes form the sidewalls of pyramidal pillars. An inverted-pyramid cavity structure with "concave" corners is preferable over a non-inverted pyramid pillar structure with "convex" corners because of the following reasons:

(1) The silicon anisotropic etching of inverted-pyramidal cavities self-terminates when two (111) plane meet, while in the non-inverted-pyramid pillars case, the etching continues with higher etch rate at the convex edges where two (111) planes meet. Therefore, from the manufacturability perspective, the former case is preferred because of its convenient process control;

(2) Because inverted pyramidal cavities have only (111) planes for sidewall and (100) planes for top surface, an epitaxial growth from these crystallographic surfaces have better geometry and process control than the non-inverted-pyramidal pillar case;

(3) Because the inverted pyramidal cavities consist of concave (111) plane intersections, the silicon template can be conveniently cleaned and re-conditioned in a short time by anisotropic etching after each re-use cycle or once every several reuse cycles.

The mechanical handle-ability of the 3-D TFSS is another key factor in the template structure design.

FIGS. 7 through 9 relate directly to the three-dimensional thin-film substrate formation methods of the present disclosure. The present methods utilize the formation methods for a reusable semiconductor template having inverted pyramidal cavities defined by sidewalls aligned along the (111) crystallographic plane of FIGS. 2 through 6. The method comprises forming inverted pyramidal microstructures with sidewalls aligned along the (111) crystallographic plane, on the front side of a template, then forming a mechanically-thin-weak (MWT) layer at a controlled depth under the front side surface of the template through high energy light-mass species (such as $H_2$ proton or He) implantation and subsequent annealing, then releasing the top template layer by cleaving the template along the MWT layer. The released top template layer forms a three-dimensional thin-film semiconductor substrate. A key advantage of the disclosed method is the formation of a MWT layer at a uniform depth parallel to the 3-D surface features aligned along the (100) and (111) crystallographic planes of the template.

In operation, the disclosure provides a method for manufacturing a three-dimensional thin-film semiconductor substrate (3-D TFSS) for making solar cells. The 3-D TFSS is a free standing, self-supporting substrate that is released/separated from a reusable silicon template (which may be formed on the surface of a substrate or an ingot), which comprises a plurality of pre-structured 3D patterns in the form of inverted pyramid structures formed using wet crystallographic etch. Importantly, the silicon template or ingot may be reused to form the 3-D TFSS numerous times before being recycled or nearly fully consumed.

FIG. 7 shows an embodiment of an overall fabrication process flow 270 depicting major fabrication process steps for manufacturing an inverted pyramidal silicon template and three-dimensional thin-film silicon substrate according the disclosed MWT layer formation method. The template formation steps in FIG. 7, steps 272 through 280, substantially mirror the template formation steps of FIG. 5, steps 105 through 140, and their corresponding description. However, the 3-D TFSS formation and release steps in FIG. 7, steps 282 through 292, capture the substrate formation and release methods of the present disclosure and thus are different from the 3-D TFSS formation and release steps in FIG. 5, steps 145 through 165.

As described with reference to FIG. 5 above, in FIG. 7 the silicon template making process starts with step 272 beginning with a mono-crystalline (100) silicon wafer. The starting wafer may be in circular or square shapes. Step 274 involves forming a thin hard masking layer on the exposed wafer surfaces. The hard masking layer is used to mask the silicon surface areas that do not need to be etched in the later steps— the surface areas that will become the top surface of the template. The proper hard masking layer includes, but is not limited to, thermally grown silicon oxide and low-pressure vapor phase deposited (LPCVD) silicon nitride. Step 274 includes a photolithography process, which consists of photoresist coating, baking, UV light exposure over a photomask, post baking, photoresist developing, wafer cleaning and drying. After this step, the pattern on the photomask depicting an array or a staggered pattern of inverted pyramidal base openings, will be transferred to the photoresist layer. The patterned photoresist layer is used as a soft masking layer for hard masking layer etching. Then the photoresist pattern is transferred to the hard masking layer layered underneath by chemical etching, such as etching a thin silicon oxide layer with buffered HF solution. Other wet etching methods and dry etching methods as known in semiconductor and MEMS wafer processing may also be used. Then the remaining soft masking layer, i.e. the photoresist layer, is removed and the wafer is cleaned. Examples of photoresist removal process include wet methods, such as using acetone or piranha solution (a mixture of sulfuric acid and hydrogen peroxide), or dry methods such as oxygen plasma ashing.

In step 276 the wafers are batch loaded in an anisotropic silicon wet etchant such as KOH solution. The typical etch temperature is in the range of 50° C. to 80° C. and etch rate is about 0.2 um/min to 1 um/min. TMAH (tetramethylammonium hydroxide) is an alternative anisotropic silicon etching chemical. The KOH or TMAH silicon etch rate depends upon the orientations to crystalline silicon planes. The (111) family of crystallographic planes are etched at a very slow rate and are normally "stop" planes for the anisotropic etching of a (100) silicon wafer with patterned hard mask. As a result, the intersection of two (111) planes or a (111) plane with a bottom (100) plane produce anisotropic etching structures for (100) silicon wafers after a time-controlled etch. Examples of these structures include V-grooves and pyramidal cavities with sharp tip cavity bottom (where (111) planes meet) or a small flat cavity bottom (a remaining (100) plane).

Advantages of the inverted pyramidal template of the present disclosure include: (i) the template KOH etching process is more convenient to control and has a low manufacturing cost compared to other silicon etching methods, such as RIE dry etching; (ii) the (111) plane dominant 3-D structure provides good porous silicon forming uniformity and epitaxial silicon quality due to the (111) plane sidewall smoothness and predictable and repeatable epitaxial growth rates; (iii) the dimensions, shape, and profiles of the inverted pyramidal structure on the template may be maintained conveniently and restored easily by a short KOH etching if needed after multiple template reuse cycles.

Anisotropic wet etching of crystalline silicon is one of the key technologies for silicon micromachining. Due to differing chemical reactivities of certain crystal planes of the silicon, anisotropic etchants etch much faster in one direction than in another, exposing the slowest etching crystal planes over time. As an example, when etching a (100) silicon wafer with patterned hard mask particularly oriented, an anisotropic etching slow down markedly at (111) planes of silicon, relative to their etch rates for other planes. As a result, the etching exhibits perfectly flat surfaces and well-defined angles. Examples of anisotropic etchants include KOH, NaOH, TMAH and EDP.

Anisotropic wet etching has long been used to make simple structures such as diaphragms and cantilevers for micro-electro-mechanical systems (MEMS). One of key advantages of using anisotropic wet silicon etching, such as Potassium Hydroxide (KOH), is its repeatability and uniformity in silicon etching while maintaining a low production cost. In additions, when the KOH etching reaches (111) crystallographic planes, it etches the (111) planes with substantially slower etch rates. As a result, the manufacturing etching process is convenient to control with much wider process control windows and much lower cost than other silicon etching methods, such as DRIE silicon dry etching.

In step 278 of FIG. 7 the remaining hard masking layer is removed, by HF solution in the case the hard masking layer is silicon dioxide. Next, the wafer may be cleaned in standard SC1 (mixture of $NH_4OH$ and $H_2O_2$) and SC2 (mixture of HCL and $H_2O_2$) wafer wet cleaning solutions followed by a thorough deionized wafer rinsing and hot $N_2$ drying. The disclosed process results in a silicon template with inverted pyramidal cavities. Step 280 of FIG. 7 marks the beginning of the silicon template re-use cycle.

Steps 282 through 292 of FIG. 7 show an embodiment of the 3-D TFSS formation and release process steps of the present disclosure. Step 282 comprises a high energy ion implantation process. Here, a high kinetic energy beam of species with small mass—such as protons (in the form of hydrogen) or helium—irradiates the silicon template in a scanning process. The incident protons have a uniform high energy which is lost as the protons traverse a silicon thickness in the template and eventually are stopped in the same predetermined depth of bulk silicon under the top surface. In the present disclosure, the proton implantation dose is preferably larger than $5\times10^{16}$ atoms/cm$^2$, the proton energy is preferably larger than 1 MeV, and the beam current is preferable larger than 1 mA. Preferably, the silicon template is maintained at relatively low temperature, such as less than 200° C. during the proton implantation in order to have a tight depth control of the implanted proton profile. The inverted pyramidal cavities with sidewalls aligned along the (111) crystallographic plane allow for a maximum concentration of the implanted species at a uniform depth parallel to the (111) planes during the ion implantation process. Common methods for ion implantation include, but are not limited to, the use of a Radio Frequency Quadrupole (RFQ) linear accelerator. Further, the ion implantation process may employ a variety of implantation dose ranges, energy ranges, and temperature ranges in order to concentrate the ions at a specified and uniform depth below and parallel to the top surface of the template.

In step 284, the template is annealed at a high temperature, in the range of 300° C. to 600° C., which causes micro-cracks to form at the maximum concentration of high energy species layer implanted at a uniform depth within the silicon template in step 282 as the high energy ions convert to gas, for example implanted hydrogen converts H$_2$ gas. During annealing, the maximum concentration of high energy species layer converts to a mechanically-weak-thin (MWT) layer comprising the micro-cracks and voids formed as a result of the high energy species conversion to gas. Thus, the MWT layer is formed parallel to and beneath the template surfaces aligned along the (100) and (111) crystallographic planes. Optionally, as illustrated by step 286, the proper formation of the MWT may take several ion implantation and annealing cycles using any combination of implantation and/or diffusion—such processes may include low energy ion implantation methods.

In step 288, optional steps may be taken in order to prepare the surface of the template for process into a solar cell. The optional steps include, but are not limited to, diffusion, surface passivation, or anti-reflection coating (ARC) thin film deposition and metallization.

In the case that the depth of the mechanically-weak-thin layer is less than 20 um from the top surface of the template, or in other words, the silicon layer which forms the 3-D TFSS is ultra-thin, an optional reinforcement layer may be applied on top of the said substrate prior to its release. The reinforcement plate can be a conformal polymer layer, such as a vapor phase deposited thin Parylene layer in the range of 1 um to 20 um thick. Even though the Parylene layer is thin, it prevents the initiation and propagation of cracks of silicon substrate. Alternatively, a flat polymer plate may be mounted on the top substrate surface in a vacuum. The vacuum pockets of the inverted pyramidal cavities will keep the plate and the substrate bonded therefore serves as an reinforcement during substrate release. In yet another alternative approach, a reinforcement plate with a thin layer of adhesive may be laminated on top of the said substrate prior to its release. The reinforcement plate may be permanently mounted on the released substrate or removed after certain cell processing steps as a temporary reinforcement.

Release pre-treatment steps, 290, may then be performed in preparation for separating the template top surface and base along the MWT. These steps include three-dimensional thin-film semiconductor substrate border definition and release initiation. Additionally, prior to the cleaving of the template along the MWT layer to release the top surface, an encompassing border trench may be made on the peripheral of the active wafer area to facilitate the release of the TFSS. The encompassing trenches may be formed by controlled laser cutting (laser ablation process) and their depths are preferably in the range of 5 um to 100 um. The trenches define the boundary of the 3-D TFSS to be released and allow initiation of the release from the trenched region. The remaining top surface of the template may be removed by mechanical grinding or polishing of the template edges. Alternatively, the thin silicon layer above the mechanically-weak-thin layer at the template edge can be locally removed by mechanical grinding or polishing. As a result, the border of the 3-D TFSS is defined prior to its release.

Step 292 is a release step which divides the template along the MWT layer separating the top surface of the template from the template bulk. In other words, the 3-D TFSS is released from the template at the MTW layer. Releasing methods include mechanical pulling using a vacuum chuck and ultrasonic releasing in distilled water. The epitaxial silicon layer release methods disclosed in U.S. Patent Pub. No. 2010-0022074 entitled, SUBSTRATE RELEASE METHODS AND APPARATUS by common inventors David Xuan-Qi Wang and Mehrdad M. Moslehi are hereby incorporated by reference and may be used to separate the 3-D TFSS from the template of the present disclosure along the mechanically-weak-thin layer. The 3-D TFSS may be released in an ultrasonic DI-water bath. Or in another release method, the 3-D TFSS may be released by direct pulling with template backside and top surface vacuum chucked. Using this method the MWT layer may be fully or partially fractured. The chucks may use either electrostatic or vacuum chucking to secure the wafer. The template is first placed on bottom wafer chuck with TFSS substrate facing upwards. A bottom chuck secures the template and the top wafer chuck is gently lowered and secures top surface of the template. The activated pulling mechanism lifts top chuck upwards separating the top surface from the template. The movement may be guided evenly by slider rails.

After the 3-D TFSS release, the template surface retains surface topography (the 3-D surface features) of the template prior to ion implantation. However, the template may optionally be reconditioned, step 294, before reuse. For example, after removal of the mechanically-weak-thin layer from the template, the template is cleaned by using diluted HF and diluted wet silicon etch solution, such as TMAH and/or KOH to remove the remaining MWT layer and silicon particles. Then the template is further cleaned by conventional silicon wafer cleaning methods, such as SC1 and SC2 wet cleaning to removal possible organic and metallic contaminations. Finally, after proper rinsing with DI water and N$_2$ drying, the template is ready for another re-use cycle.

The released 3-D TFSS may then be cleaned, step 296. For example, the released 3-D TFSS backside surface is cleaned by short silicon etching using KOH or TMAH solutions to remove the silicon debris and fully or partially remove the quasi-mono-crystalline silicon (QMS) layer. The 3-D TFSS then proceeds to further downstream processing into a solar cell, 298.

Although the MWT layer may be formed in any region that has a pre-determined depth from the wafer top surface, it is important to note, the inverted pyramidal structural design provides a desirable 3D profile because of the (111) crystal planes used. Before the implantation, the three-dimensional template top surfaces are pre-structured by self-terminating the anisotropic etching on all (111) crystal planes. Since the maximum concentration depth of the implanted species is controlled to be uniform across the wafer, the (111) crystal plane profile of the wafer top surface is directly transferred onto the surface profile of the buried MWT layer. That is, the MWT layer forms at a uniform depth parallel to the top surfaces of the template. Thus, the resulting released 3-D TFSS is a top layer of the template reflecting the template's 3-D surface features, and the resulting template retains its original 3-D surface features for a subsequent 3-D TFSS formation process. Following are several of the advantages of using the (111) crystallographic planes to form three-dimensional surface features in accordance with the disclosed 3-D TFSS formation method:

(1) An MWT layer formed along (111) crystallographic planes is desirable for releasing/cleaving because (111) crystallographic planes have lower surface energy than other crystallographic planes. Therefore the releasing/cleaving front control along (111) planes is more reliable than an MWT layer formed along other crystallographic planes;

(2) After each 3-D TFSS release, the pre-structured (111) crystallographic planes and its 3-D profile (inverted pyramidal cavities) are readily transferred and maintained on the template top surface. Thus the method results in a self preserving template topography and numerous reuses of the template are made possible while substantially maintaining the original 3D inverted pyramid template surface topography; and (3) Both the top and bottom surfaces of a released 3D-TFSS are made of (111) planes, allowing a post release surface cleaning process to be readily performed using diluted anisotropic silicon etchants, such as KOH and TMAH. The cleaned template may then be used as a pre-structured template for making many more 3D-TFSS substrates by repeating the implantation, annealing and releasing processes, again while essentially preserving the template 3D topography throughout each use.

FIGS. 8A through 8C depict cross-sectional drawings illustrating a process flow for manufacturing a 3-D TFSS using an inverted pyramidal silicon template according to the disclosed mechanically-weak-thin layer formation process. FIG. 8A illustrates the ion implantation step corresponding to step 282 in FIG. 7. Template formation methods, such as those described and shown in detail in FIGS. 6A through 6D, have been used to form silicon template 302 having inverted pyramidal cavities defined by sidewalls aligned along the (111) crystallographic plane in FIG. 8A. Light-mass species 308, such as protons, are irradiated and implanted into silicon template 302 with a maximum concentration at a predetermined depth, shown as maximum concentration layer 304. Maximum concentration layer 304 provides the separation line from which silicon template 302 will be separated from 3-D TFSS layer 306 (the top surface layer of the template) after the formation of the MWT. Thus, the depth of the maximum concentration of the light-mass species determines the width of the released 3-D TFSS. The predetermined depth is a function of the implanted species, such as hydrogen (proton) or helium, and the implantation energy applied. The depth may be as small as 10 um, making the width of 3-D TFSS 306 also in the range of 10 um. In the region of the maximum concentration of ions, different types of defects are generated—in the case of hydrogen, Si—H defects are generated. The defect region, which is also the maximum concentration of implanted species, formed by the implantation is the thin layer beneath and parallel to the pre-structured template top surface, shown in FIG. 8A as maximum concentration layer 304. These defects will form micro-cracks and voids as the high energy species converts to gas during the annealing process.

Each pyramidal cavity is defined by sidewalls aligned with the (111) crystallographic plane. Because the angle between the four sidewalls forming the cavity and the horizontal (100) plane is 54.7°, the vertical bombardment of light-mass species provides uniform and even coverage over all four inverted pyramid cavity sidewalls. Therefore, the maximum concentration of the implanted species resides at a uniform depth beneath the (111) surfaces and parallel to the (111) planes. As shown in FIG. 8A, maximum concentration line 304 forms at a uniform depth parallel to the top surface structures.

FIG. 8B illustrates the formation of the mechanically-weak-thin layer by a thermal treatment (annealing) step corresponding to step 284 in FIG. 7. When ion implanted template 312 is annealed at a temperature higher than 300° C., micro-cracks, voids, and blisters are generated in the maximum concentration of implanted ions layer due to the evolution of the light-mass species to gas. As a result, MWT layer 314 is formed with a three dimensional profile parallel to the pre-structured template surface. The voids and micro-cracks in the mechanically-weak-thin layer allow for the relatively simple separation of silicon template 312 and 3-D TFSS layer 316. Because the MWT layer is structurally weaker than the rest of the template, template cleaving methods naturally occur along the MWT layer.

FIG. 8C illustrates the release of the 3-D TFSS from the silicon template along the MWT layer corresponding to step 292 in FIG. 7. Releasing methods include mechanical pulling using vacuum chucking on the top and bottom surfaces of the template and ultrasonic releasing in a distilled water bath.

The epitaxial layer release methods disclosed in U.S. Patent Pub. No. 2010-0022074 entitled, SUBSTRATE RELEASE METHODS AND APPARATUS by common inventors David Xuan-Qi Wang and Mehrdad M. Moslehi are hereby incorporated by reference. These methods may be used to separate the 3-D TFSS from the template of the present disclosure along the mechanically-weak-thin layer. The 3-D TFSS may be released in an ultrasonic DI-water bath. Or in another release method, the 3-D TFSS may be released by direct pulling with template backside and top surface vacuum chucked. Using this method the MWT layer may be fully or partially fractured. The chucks may use either electrostatic or vacuum chucking to secure the wafer. The template is first placed on bottom wafer chuck with TFSS substrate facing upwards. A bottom chuck secures the template and the top wafer chuck is gently lowered and secures top surface of the template. The activated pulling mechanism lifts top chuck upwards separating the top surface from the template. The movement may be guided evenly by slider rails.

FIG. 9 illustrates the template top surface profile movement through multiple 3-D TFSS formation cycles and template re-uses. 3-D TFSS layer 322 represents a first template use cycle and 3-D TFSS layer 324 represents a subsequent template use cycle. The reusable template is consumed as 3-D TFSS are fabricated. However, the original inverted pyramidal topography of the template used to form 3-D TFSS layer 322 is preserved through the multiple reuses—the sidewalls forming the inverted pyramidal cavities aligned along the (111) crystallographic plane are maintained after each 3-D TFSS formation cycle. Optionally, when necessary, after a 3-D TFSS release, the template may be cleaned in diluted KOH or TMAH solution for a short time to remove the silicon debris and optionally restore the (111) crystallographic planes for next re-use cycle. As the re-use cycle progresses, the template becomes thinner and after a predetermined number of re-use cycles the template is either reconditioned (e.g., using wet crystallographic etch in KOH or TMAH) to enable further reuse cycles or the remaining template material is recycled.

In operation, the disclosed subject matter provides a method for forming a 3-D TFSS from a template. The fabrication method consists of forming microstructures on a silicon wafer/template front side, high energy light-mass species (such as $H_2$, proton or He) implantation and annealing to form a MWT layer underneath the front surfaces of the template at a controlled depth, and releasing the top layer of the template for use as a 3-D TFSS by cleaving template along the MWT layer. The released 3D-TFSS is then processed to make a solar cell and the template is cleaned and optionally reconditioned as needed so that it may be reused. Reconditioning of the template can be achieved as necessary (after several reuse cycles) by performing a timed crystallographic wet etch process in KOH or TMAH.

FIG. 10 illustrates a template having an array, or non-staggered, pattern inverted pyramidal cavities. Pyramidal cavities 330 all have the same base opening size and thus the same cavity depth, and are arranged in an array. Ridges 332 form lateral rows and columns between the inverted pyramidal cavities. These ridges may be referred to as frames, grids, space lines, or ridge lines. Ridges 332 are aligned to the (100) crystallographic direction of the template. The straight long ridges between the cavities on the template will be transferred to the backside of a corresponding 3-D TFSS made in accordance with the disclosed subject matter in long V-groove shapes. The V-grooves on the 3-D TFSS are aligned to the (100) crystallographic directions. Thus when the 3-D TFSS experiences in-plane or out-of-plane bending or twisting, stress concentration and bending moment on the long V-grooves are higher than the inverted pyramidal cavity sidewalls. Therefore, the V-grooves behave like an out-of-plane bending/rotation axis, resulting in a very flexible substrate. Additionally, because the V-grooves are aligned in the <100> direction, once a micro fracturing is initiated from either the edge or the middle of the 3-D TFSS, it propagates easily along the V-grooves and causes the TFSS to crack. As a result, an advantage of this type of TFSS is mechanical flexibility and a disadvantage is that the TFSS is relatively weak. Therefore one of the key factors in making TFSS with reliable mechanical rigidity and strength is to avoid long and straight ridges, shown as ridges 332, on the template.

FIG. 11A through 11D illustrate four examples of template layout patterns of staggered inverted pyramidal cavity designs. An advantage of one embodiment of the present disclosure to increase the mechanical strength of a 3-D TFSS through staggered patterns of inverted pyramidal cavities. Staggered patterns avoid long V-groove on the 3-D TFSS because staggered patterns limit the length of the ridges forming the base openings of the inverted pyramidal cavities (in both rows and columns as shown form a top view of the template). The staggered pattern designs of the present disclosure are not limited to the described embodiments but instead include any staggered pattern of inverted pyramidal cavities.

Figure 11A:
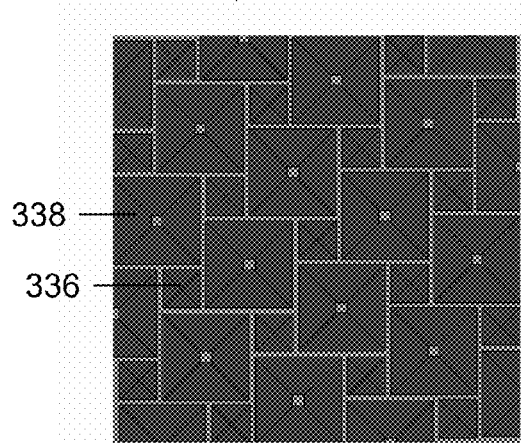

FIG. 11A shows a staggered inverted pyramidal cavity layout pattern that consists of two cavity sizes. Small cavity 336 has a base opening half the size of the base opening of large cavity 338. In this case, the V-groove length on the corresponding 3-D TFSS will be about 1.5 times as long as the length of one side of the base opening of large cavity 338. Additionally, each ridge on template 334 and each V-groove on the formed 3-D TFSS is intersected at twice (each at one third the length of the ridge or V-groove) by neighboring perpendicular ridges or V-grooves. As a result, the intersection of V-grooves of a 3-D TFSS made with this staggered pattern are uniformly spread giving this staggered pattern good mechanical handle-ability and uniform mechanical strength across its lateral plane.

Figure 11B:
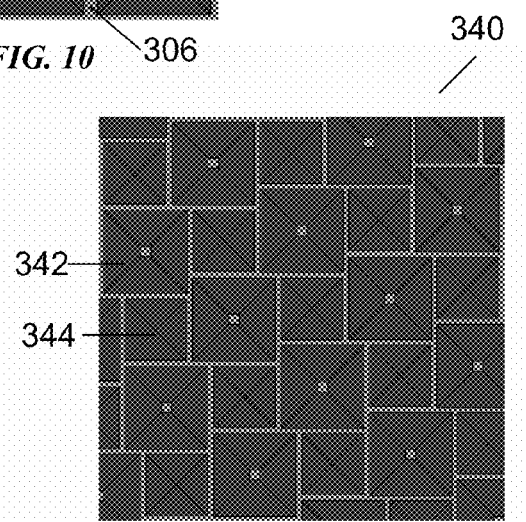

FIG. 11B presents another alternative staggered inverted pyramidal cavity layout pattern that consists of two cavity sizes. Small cavity 344 has a base opening that is a fraction of the base opening of large cavity 342. Shown, the ratio between the two cavity sizes is between 1 and 2. This cavity layout pattern is a general pattern of the layout shown in FIG. 11A. In this design, the V-groove length on the formed 3-D TFSS is about 1 to 2 times of the cavity length. Furthermore, alternatively the inverted pyramidal cavity layouts may include different inverted pyramidal cavity shapes (such as rectangular) and staggered inverted pyramidal cavities with more than two sizes.

Figure 11C:
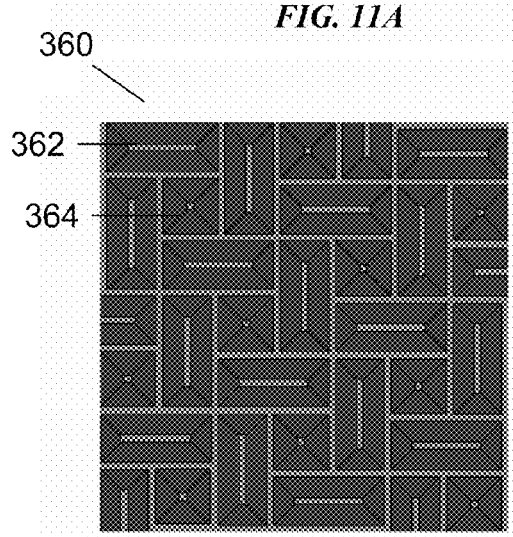

FIG. 11C presents an alternative staggered inverted pyramidal cavity layout that consists of rectangular cavity 362 and square cavity 364. Square cavity 364 has a base opening size equal to the width of the base opening of rectangular cavity 362. Each square cavity is surrounded by two pairs of perpendicularly arranged rectangular cavities. Thus, the length of the V-grooves on the formed 3-D TFSS will be about the length of the base opening of rectangular cavity 362 plus twice the width of rectangular cavity 362.

Figure 11D:
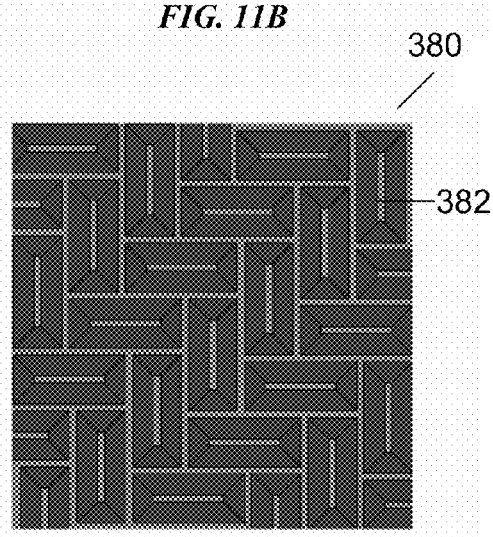

FIG. 11D presents yet another alternative staggered inverted pyramidal cavity layout that consists of one size of inverted pyramidal cavities. Each rectangular cavity 382 has the same size and is arranged in a staggered perpendicular format. In this case, the length of the V-grooves on the 3-D TFSS will be about the length of the base opening of rectangular cavity 382 plus the width of rectangular cavity 382 on the template.

FIG. 12 is a process flow depicting major fabrication process steps of an exemplary method for making a 3-D TFSC using the released 3-D TFSS, in a block diagram 400. The 3-D TFSC fabrication process starts in Step 405 with a p-type silicon 3-D thin film substrate (3-D TFSS) having inverted pyramidal ridges on a top surface plane and inverted pyramidal apex regions on a bottom surface. Step 410 involves selectively coating the top ridge areas of the 3-D TFSS with an n-type (such as phosphorus) liquid dopant. Viewed from a top perspective, the coated areas form long lines that are connected at cell edges to form fingers and busbar patterns as in regular flat silicon based solar cells. However, the doped fingers and busbar lines on the top ridge areas may not be straight lines if the inverted pyramidal cavity pattern layout is staggered. The selective liquid dopant coating may be done by aligned screen printing, roller coating, or direct inkjet dispense. After the coating, the coated layer is dried and cured (e.g., by thermal curing at 250° C. to 400° C. or UV irradiation). Step 415 involves selectively coating the bottom side of the 3-D TFSS with p-type (such as boron) liquid dopant. The liquid dopant is selectively coated to the inverted pyramidal apex regions on the bottom surface of the 3-D TFSS by aligned or self-aligned roller coating, screen printing, or dip-coating methods. After the coating, the coated layer is dried and cured (e.g., by thermal curing at 250° C. to 400° C. or UV irradiation). Step 420 involves forming n++ selective emitter and p++ base diffusion contact regions by thermal annealing that may be done in a diffusion furnace at 800° C. to 950° C., where the emitter and base are concurrently formed. Step 425 involves a surface passivation process. In one embodiment, a thermal oxide layer of 10 to 200 nanometers is grown at 800° C. to 950° C. In another embodiment, PECVD silicon nitride thin layer could also be used as a surface passivation layer. The surface passivation layers are applied on both the top and bottom surfaces of the 3-D TFSS. Step 430 involves making local openings on the emitter and base contact regions by selective passivation layer chemical etching, such as by applying HF-based etchant by inkjet dispensing. The contact openings are made smaller than the dopant diffused areas to avoid shunting after metallization. Step 435 involves self-aligned metallization. The emitter and base metallized regions are concurrently formed using selective electroplating and/or electroless plating to form single or multilayer high-conductivity metallized regions of silver, aluminum, nickel, titanium, cobalt, or tantalum. For instance, the plated metal stack may include a thin (50 to 500 nanometers) barrier and adhesion layer (made of nickel) followed by a relatively thick (2 to 15 microns) layer of high-conductivity metal (silver, copper, or aluminum). In another embodiment, the metal contacts may be formed by the aligned inkjet dispense or screen printing of metal particles, such as silver nano-particles in a liquid solution or paste. Step 445 involves mounting the 3-D thin film solar cell (3-D TFSC) onto a plate with a metal surface or metal lines to interconnect the base contacts. The metal plate preferably has a reflective surface to serve as a rear reflection mirror. The mounting could direct metal-to-metal fusion or with a highly conductive adhesive. Step 450 involves packaging the fabricated solar cell into a solar module assembly. In this manufacturing module, the emitter and base metal contacts are interconnected among the solar cells to form the power output connections of a solar panel.

FIG. 13A through 13D illustrate partial cross-sectional views of a process flow for manufacturing a three-dimensional thin-film solar cell according to the process steps of FIG. 12.

Figure 13A:
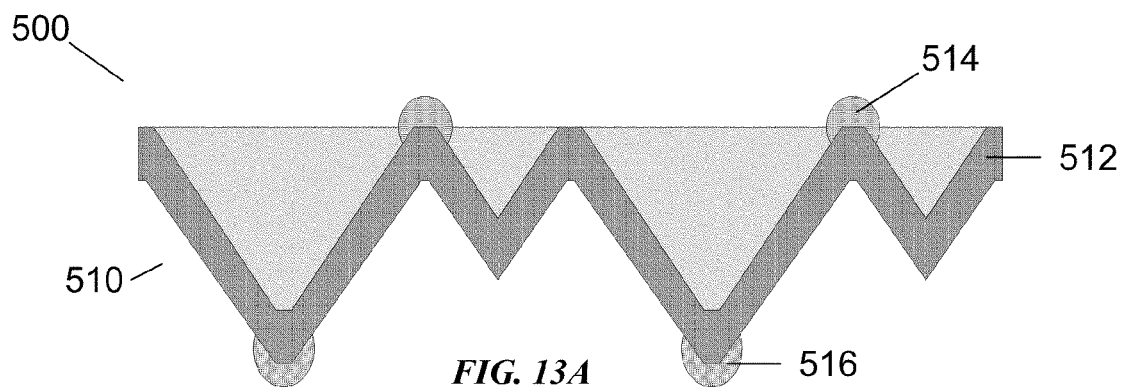

FIG. 13A illustrates 3-D TFSS 512 after the selective emitter 514 and base 516 coating steps. The liquid dopants, such as phosphorus-contained liquid for emitter and boron-contained liquid for base, are dried and cured after their selective coatings.

Figure 13B:
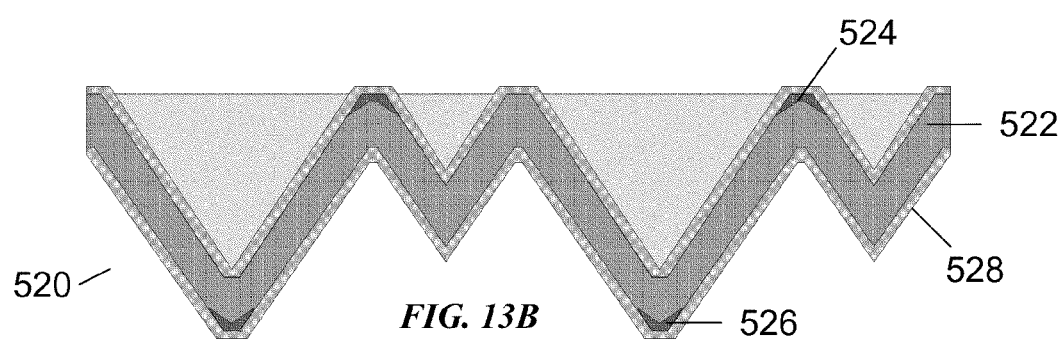

FIG. 13B illustrates 3-D TFSS 522 after the selective emitter 524 and base 526 diffusion and passivation layer 528 coating steps. The emitter and base diffusion regions are concurrently formed in a diffusion furnace with a controlled time and temperature. The actual doping profile may be extended towards to the sidewalls near the contact regions. After the emitter and base diffusion, the remaining dopant material and dielectric layers formed during the diffusion process are removed. A passivation layer is then applied on both the front and base surfaces of the 3-D TFSS. Examples of the passivation layer include thermally grown silicon dioxide and PECVD silicon nitride.

Figure 13C:
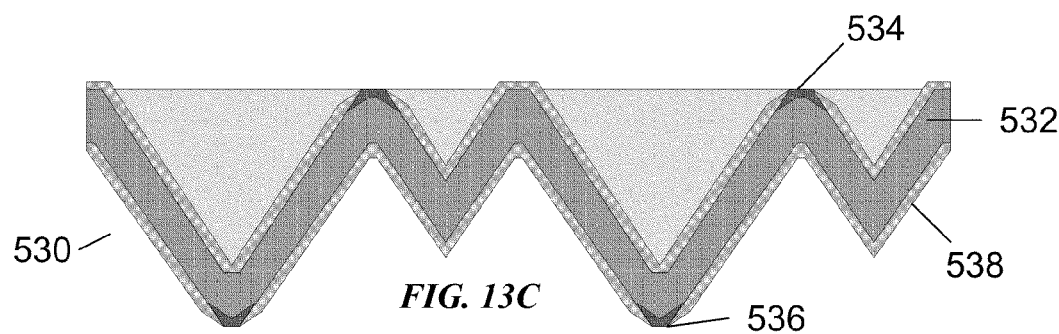

FIG. 13C illustrates 3-D TFSS 532 after the selective emitter 534 and base 536 contact openings are formed. The local openings on the emitter and base contact regions are made by selective passivation layer chemical etching, such as by applying HF-based etchant by inkjet dispensing. The contact openings are made smaller than the dopant diffused areas to avoid shunting after metallization. Portions of the top and bottom surface of the 3-D TFSS remain coated with passivation layer 538.

Figure 13D:
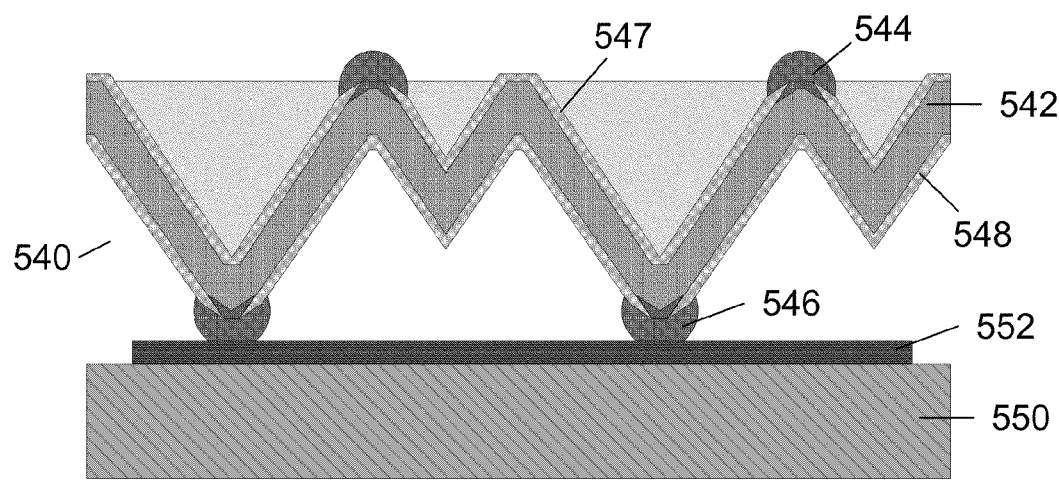

FIG. 13D illustrates a completed 3-D TFSS 542 after all the cell fabrication process disclosed in FIG. 12. The emitter metal 544 and base metal 546 are electroplated or electroless plated single or multilayer high-conductivity metallized regions (silver, aluminum, nickel, titanium, cobalt, or tantalum). Alternatively, the metal layer could be inkjet dispensed. The emitter metal contacts are formed in continuous metal lines, i.e. fingers and busbars on the 3-D TFSC top surface. However, because the base metal contacts have been formed on the inverted pyramidal apex regions on the backside of the 3-D TFSS, the base metal contacts are isolated regions. It is to be noted, the front surface passivation layer may also serve as the antireflection layer given a controlled thickness.

In one embodiment, the 3-D TFSS after metallization is mounted on a supporting non-metal plate 550 with continuous metal surface or patterned metal lines 552 to form the base interconnects of the 3-D TFSC. Portions of the top and bottom surface of the 3-D TFSS remain coated with passivation layer 548.

The 3-D TFSS and cell process flows as shown as FIGS. 5, 6, 7, 8, 12 and 13 may be applied to substrate doping polarity of n-type for p-type selective emitters. Thus the 3-D TFSS base could be either n-type or p-type with corresponding emitter polarities.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for fabrication of a three-dimensional thin-film solar cell semiconductor substrate from a semiconductor template, the method comprising:
    anisotropically etching a semiconductor template to form three-dimensional surface features comprising a top surfaces substantially aligned along a (100) crystallographic plane of said semiconductor template and a plurality of inverted pyramidal cavities defined by sidewalls substantially aligned along a (111) crystallographic plane of said semiconductor template;
    implanting a dose of relatively high energy light-mass species at a uniform depth and parallel to said top surfaces and said sidewalls defining said plurality of inverted pyramidal cavities of said template according to an ion implantation process;
    annealing said semiconductor template to convert said dose of relatively high energy light-mass species to a mechanically-weak-thin layer; and
    cleaving said semiconductor template at said mechanically-weak-thin layer to release a three-dimensional thin-film semiconductor substrate from said semiconductor template.

2. The method of claim 1, wherein said semiconductor template is a silicon template.

3. The method of claim 1, wherein said semiconductor template is a monocrystalline silicon template.

4. The method of claim 1, wherein said semiconductor template is a polycrystalline silicon template.

5. The method of claim 1, wherein said semiconductor template is a template selected from the group consisting of gallium, arsenide, or germanium.

6. The method of claim 1, wherein said semiconductor template is a reusable semiconductor template for use in multiple three-dimensional thin-film solar cell semiconductor substrate fabrication cycles.

7. The method of claim 1, wherein said high energy light-mass species is proton.

8. The method of claim 1, wherein said high energy light-mass species is helium.

9. The method of claim 1, wherein said ion implantation process comprises bombarding said three-dimensional surface features of said semiconductor template with high energy light-mass species generated using a Radio Frequency Quadrupole linear accelerator.

10. The method of claim 1, further comprising the step of forming a border definition trench defining the peripheral of the 3-D TFSS prior to cleaving said semiconductor template at said mechanically-weak-thin layer.

11. The method of claim 10, wherein said step of forming a border definition trench further comprises forming a border definition trench by laser ablation prior to cleaving said semiconductor template at said mechanically-weak-thin layer.

12. The method of claim 10, wherein said step of forming a border definition trench further comprises forming a border definition trench by mechanically grinding the edges of said semiconductor template to the depth of said mechanically-weak-thin layer prior to cleaving said semiconductor template at said mechanically-weak-thin layer.

13. The method of claim 1, wherein said step of cleaving said semiconductor template at said mechanically-weak-thin layer further comprises pulling said three-dimensional thin-film semiconductor substrate from said semiconductor template with an electrostatic chuck.

14. The method of claim 1, wherein said step of cleaving said semiconductor template at said mechanically-weak-thin layer further comprises submersing said semiconductor template in an ultrasonic water bath.

15. The method of claim 1, further comprising the step of cleaning said template with a selective etchant solution to reestablish the structure of the three-dimensional surface features after the release of said three-dimensional thin-film semiconductor substrate.

16. The method of claim 1, wherein said step of anisotropically etching a semiconductor template to form three-dimensional surface features utilizes a solution containing at least one of KOH, NaOH, or TetraMethyl-Ammonium-Hyrdoxide (TMAH) as an etchant.

17. The method of claim 1, further comprising the step of applying a reinforcement plate to the top surface of the three-dimensional thin-film semiconductor substrate to be released prior to the step of cleaving said semiconductor template at said mechanically-weak-thin layer.

18. The method of claim 1, wherein said plurality of inverted pyramidal cavities are rectangular pyramidal cavities defined by four sidewalls substantially aligned along a (111) crystallographic plane of said semiconductor template.

19. The method of claim 1, wherein said plurality of inverted pyramidal cavities comprise a plurality of pyramidal sizes.

20. The method of claim 1, wherein said plurality of inverted pyramidal cavities comprises at least one pyramidal cavity further defined by a bottom surface aligned along a (100) crystallographic orientation plane of said semiconductor template.

* * * * *